United States Patent
Hahn

(10) Patent No.: US 7,318,079 B2
(45) Date of Patent: Jan. 8, 2008

(54) METHOD AND DEVICE FOR FILTERING A VIDEO SIGNAL

(75) Inventor: Marko Hahn, Munich (DE)

(73) Assignee: MICRONAS GmbH, Freiburg (DE)

( * ) Notice: Subject to any disclaimer, the term of this patent is extended or adjusted under 35 U.S.C. 154(b) by 617 days.

(21) Appl. No.: 10/872,151

(22) Filed: Jun. 18, 2004

(65) Prior Publication Data

US 2005/0091296 A1   Apr. 28, 2005

(30) Foreign Application Priority Data

Jun. 18, 2003  (DE) ................. 103 27 578

(51) Int. Cl.
*G06F 17/10* (2006.01)
(52) U.S. Cl. .................................... 708/300
(58) Field of Classification Search ................ 708/300
See application file for complete search history.

(56) References Cited

U.S. PATENT DOCUMENTS

| 5,237,524 A | 8/1993 | Heinemann ................. 364/724 |
| 5,412,432 A | 5/1995 | Hong ......................... 348/625 |
| 2002/0158988 A1 | 10/2002 | Wischermann ............. 348/571 |
| 2003/0048367 A1 | 3/2003 | Rieder et al. |
| 2004/0047370 A1* | 3/2004 | Pessoa et al. ............... 370/526 |
| 2004/0100579 A1 | 5/2004 | Hahn et al. ................. 348/448 |

FOREIGN PATENT DOCUMENTS

FR   2 696 260   4/1994   ............... 15/66

* cited by examiner

*Primary Examiner*—Tan V. Mai
(74) *Attorney, Agent, or Firm*—O'Shea, Getz & Kosakowski, P.C.

(57) ABSTRACT

A method and device operable per the method for high-pass filtering an input signal having a sequence of signal values to provide a high-pass filtered output signal having a sequence of filtered signal values. The method includes selecting a first signal value of the input signal and a second signal value preceding the first signal value and a third signal value following the first signal value, determining an interval defined by the second and third signal values, determining a mean value of the interval, and determining whether the first signal value lies within the interval. If the first signal value lies outside the interval, determining a first distance between the first signal value and a first interval boundary and a second distance between the first signal value and a second interval boundary and a third distance between the first signal value and the mean value to provide a first, a second, and a third distance value, and selecting a signal value from a value range between the smaller of the first and second distance values and the third distance value to provide a selected signal value. If the first signal value lies within the interval, selecting a signal value from a value range between zero and half the interval width to provide the selected signal value. The sign of the selected signal value is then set depending on the position of the first signal value relative to the mean value to provide a value for the high-pass filtered output signal.

32 Claims, 17 Drawing Sheets

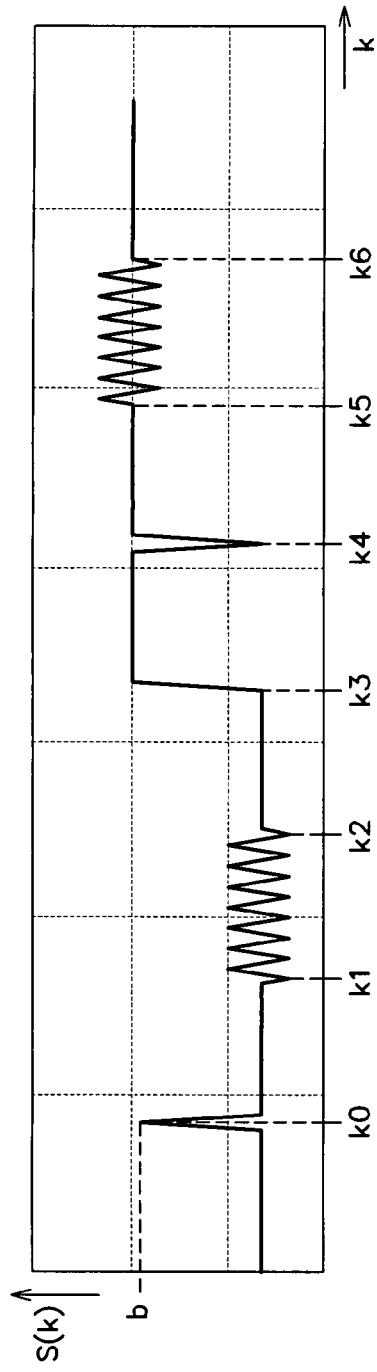
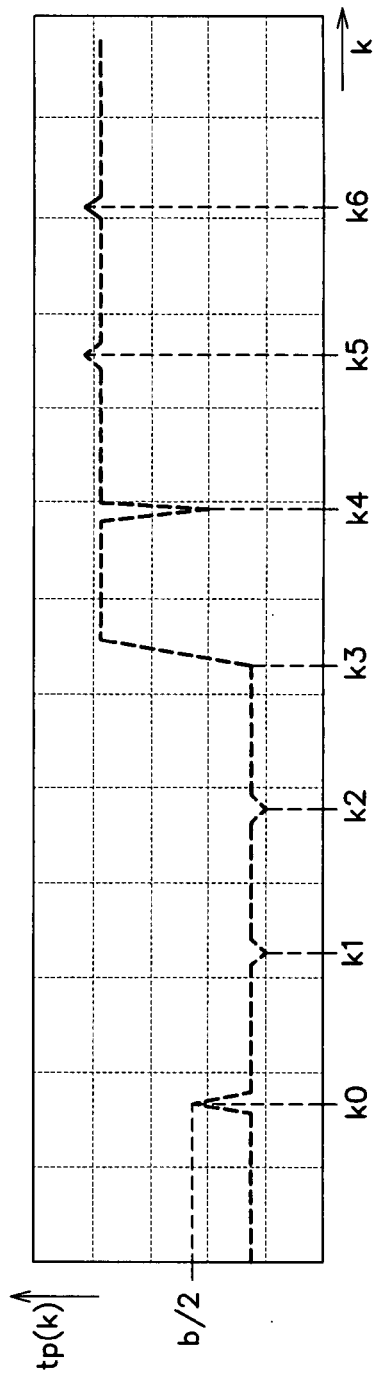
FIG. 8A
FIG. 8B

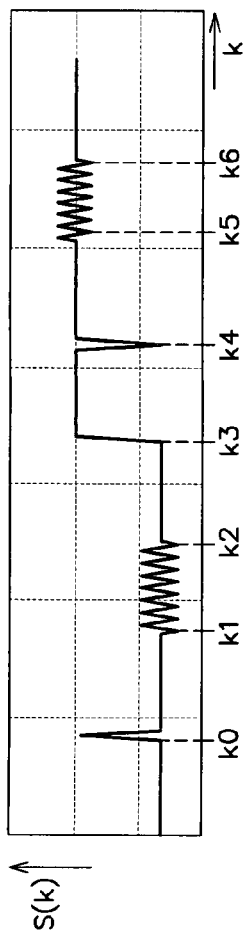
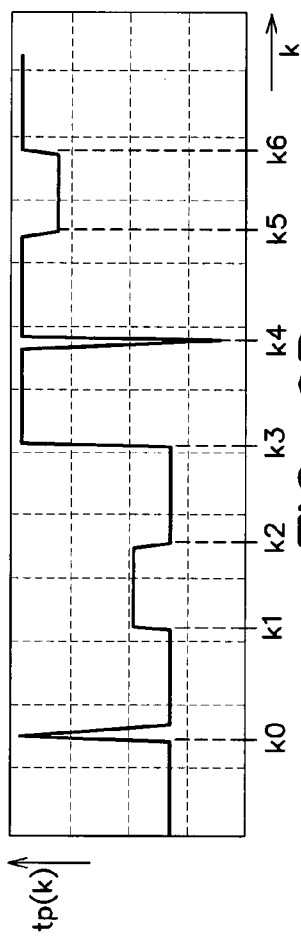
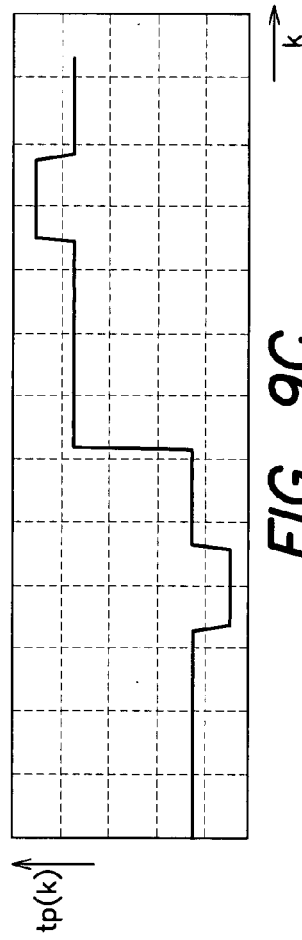
FIG. 9A
FIG. 9B
FIG. 9C

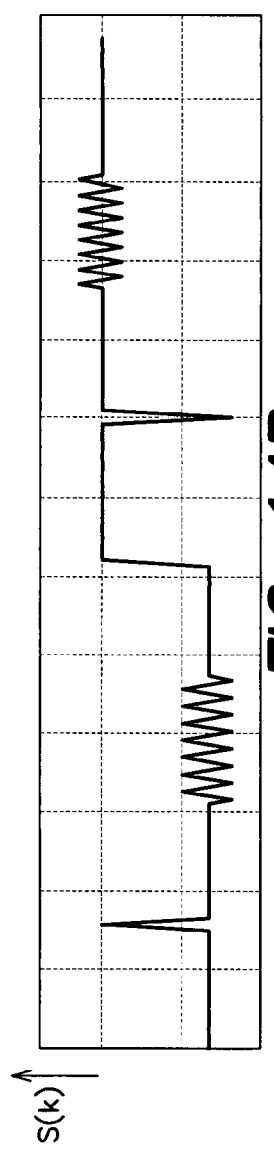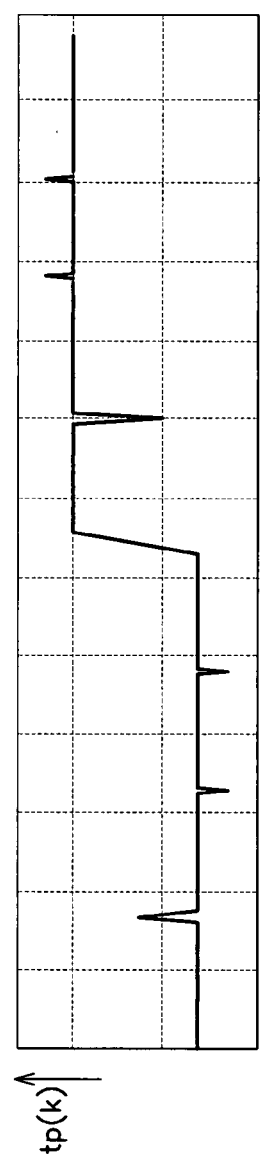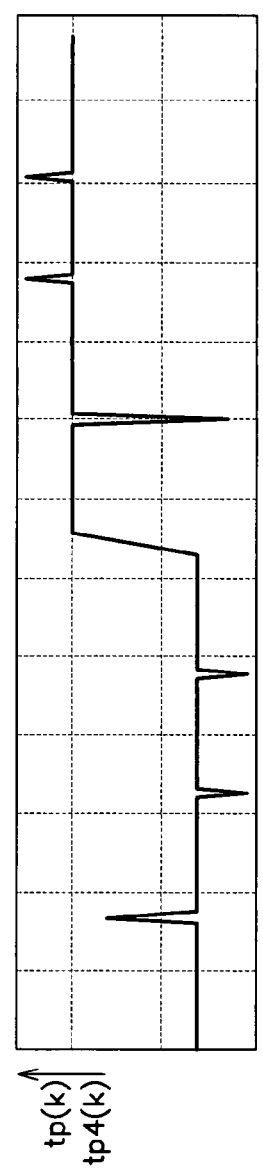

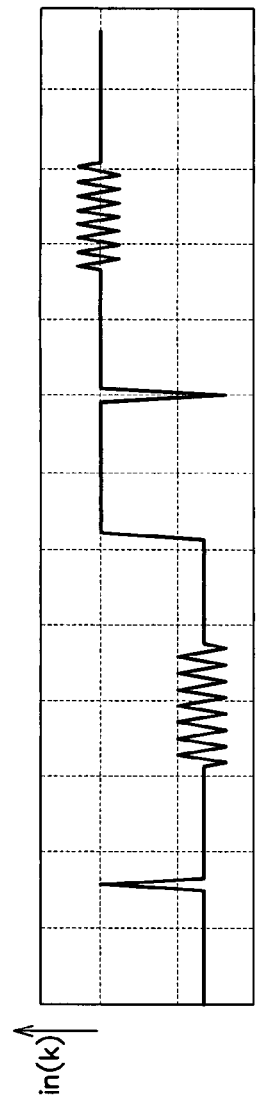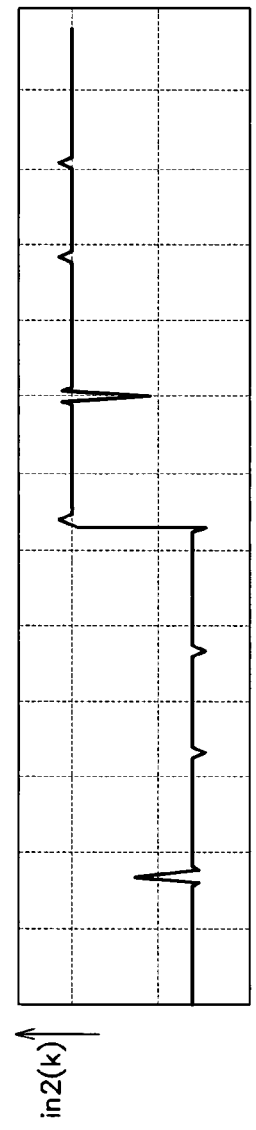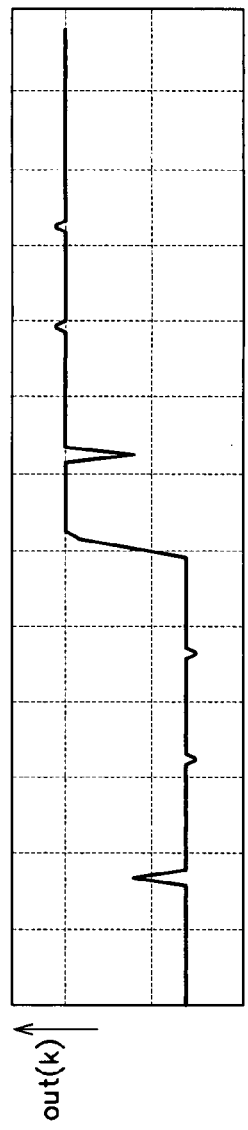
FIG. 19B (Prior Art)
FIG. 19C (Prior Art)
FIG. 19D (Prior Art)

METHOD AND DEVICE FOR FILTERING A VIDEO SIGNAL

BACKGROUND OF THE INVENTION

The present invention relates to filtering, and in particular to a method and a device for high-pass filtering of a signal.

As is known in the art and illustrated in FIG. 18A, a high-pass filter 200 may be used as part of a low-pass filter arrangement for low-pass filtering of a signal in(k). As such, the filter arrangement removes high-frequency signal components from the input signal in(k), possibly after amplification or attenuation by an amplifier 218, to provide a low-pass filtered signal as the output signal out(k). A delay element 215 equalizes any signal delays introduced by the high-pass filter 200.

Traditional high-pass filters are linear filters, such as the FIR filter 200 of FIG. 18A, which possesses a transfer function $h(z)=0.25\cdot[-z^{-2}+2z^{-1}-1]$. With respect to the input signal in(k), the filter provides an output signal value of three consecutive input signal values, the output signal value corresponding to a normalized difference between the middle of the three input signal values and the mean value of the other two input signal values.

The mode of operation of the low-pass filter of FIG. 18A for the input signal in(k) illustrated in FIG. 18B is illustrated in FIG. 18C. The low-pass filter filters out high-frequency signal components, but also pulse-like signal components are decreased and widened at their base, and edges of the input signal are partly smoothed out. The result is that the filter also filters out, to an undesirable degree, the pulses and signal steps from the input signal.

The range of application of such filter arrangements is very large, and the discrete signals that are filtered are formed, for example, by sampling a signal that is continuous over time. Such signals can also be graphical information values, which are taken from an image line-by-line or column-by-column. In the processing of television signals, there are known methods in which frames with graphical information in every line are generated from the transmitted fields, in which only every other line contains graphical information. In the event of an incorrect interpolation of the intermediate-image lines, a signal variation may be produced in the vertical direction of the picture, where maximum and minimum signal values alternate from line to line (for example, luminance values or chrominance values). Such high-frequency signal processes need to be filtered, for example to generate a gray value from a black/white variation from one line to another, in every line. However, individual signal steps, represented as brightness edges or color edges in the picture, should remain unaffected by the filter process. Similarly, signal pulses, i.e., narrow bright or dark regions in the picture, should not be removed or attenuated by the filter process.

What is needed is a method and a device for the high-pass filtering of a signal, which filters out high-frequency signal components but does not filter out signal pulses or signal steps, or does so only to a small degree.

SUMMARY OF THE INVENTION

A method for high-pass filtering of a signal having a sequence of signal values to provide a corresponding high-pass filtered signal having a sequence of filtered signal values, may include the following steps to generate a value for the filtered signal for each signal value in the sequence:

a) selecting a first signal value of the signal to be filtered and at least one second signal value preceding the first signal value in the sequence and at least one third signal value following the first signal value in the sequence;

b) determining an interval defined by the at least one second signal value and the at least one third signal value, with a first interval boundary defined by the at least one second signal value and a second interval boundary defined by the at least one third interval value;

c) determining a mean value of the interval from the at least one selected second signal value and the at least one selected third signal value;

d) determining whether the first signal value lies within the interval;

e) if the first signal value lies outside the interval, determining a first distance between the first signal value and the first interval boundary and a second distance between the first signal value and the second interval boundary and a third distance between the first signal value and the mean value to provide a first, a second, and a third distance value, selecting a signal value from a value range between the smaller of the first and second distance values and the third distance value to provide the selected signal value;

f) if the first signal value lies within the interval, selecting a signal value from a value range between zero and half of the interval width to provide the selected signal value; and g) setting the sign of the selected signal value depending on the position of the first signal value relative to the mean value, to provide the filtered signal value.

The method for high-pass filtering is a nonlinear method, in which it is first determined whether a first signal value lying in the signal sequence between the at least one second signal value and the at least one third signal value lies inside or outside an interval defined by the second and third signal values. If the first signal value lies within the interval, then a filtered signal value of zero may be generated. If the first signal value lies outside the interval, there is a pulse-like deviation of the first signal value relative to the interval boundaries, so that a filtered signal value not equal to zero is generated, reflecting the pulse-like deviation. The filtered signal value may then be chosen to correspond to the distance between the first signal value and the closest interval boundary.

The sign of the filtered signal value depends on the position of the first signal value relative to the mean of the interval boundaries, and for example the sign of the filtered signal value may be set at minus when the first signal value is smaller than the mean, while the sign may be set at plus when the first signal value is larger than the mean.

To suppress noise during the high-pass filtering, the determined distance value for each of the first, the second, and/or the third distance values is set to zero if the determined distance value is smaller than a predetermined limit value. This is based on the fact that slight deviations between signals, for example between the first signal value and the closest interval boundary, usually result from noise factors which can be suppressed.

In an exemplary embodiment, the interval boundaries may be formed by a second signal value preceding the first signal value in the sequence and by a third signal value following the first signal value in the sequence. Another embodiment specifies how to select several second signal values preceding the first signal value and several third signal values following the first signal value, how to form an interval between each second signal value and each third signal value, and for example how to select as interval boundaries the second signal value and the third signal value that define the largest interval or the smallest interval. Essentially, it is possible to select any one of each of the second and third signal values. Also, the filtered signal value may be confined to an upper or lower limit value.

The method is suitable for low-pass filtering in that it produces a high-pass filtered signal and generates the low-pass filtered signal from the high-pass filtered signal and the input signal. In the simplest case, the high-pass filtered signal may be subtracted from the delayed input signal to provide a low-pass filtered signal.

In another embodiment, the method includes the following steps:

a) limiting a high-pass filtered signal to generate a bounded high-pass filtered signal;

b) subtracting the bounded high-pass filtered signal from the input signal to generate a first low-pass filtered signal;

c) subtracting the bounded high-pass filtered signal from the high-pass filtered signal to generate a difference signal;

d) limiting the difference signal to generate a bounded difference signal; and e) adding the first low-pass filtered signal and the bounded difference signal to generate the low-pass filtered signal.

Alternatively, the difference signal is filtered prior to the step of limiting a signal dependent on the difference signal. Also, the difference signal may be weighted and added to the first low-pass filtered signal and to the bounded difference signal to generate the low-pass filtered signal.

A high-pass filter device for filtering an input signal having a sequence of signal values may include first and second high-pass filters. The high-pass filter device may also include a coring unit having a signal input that receives a signal depending on a filtered output signal of the first high-pass filter, having a control input that receives a signal depending on a signal at the output of the second high-pass filter, and having an output coupled to the output of the high-pass filter device.

The high-pass filter device adaptively filters the input signal, in that the parameter of the coring unit is set each time depending on the filtered output signal of the second high-pass filter and the input signal supplied to the second high-pass filter.

Between the output of the second high-pass filter and the control input of the coring unit a logic unit may form the absolute value of the filtered output signal of the second high-pass filter. Optionally, an amplifier having a gain between 0 and 1, may be connected between the second high-pass filter and the control input of the coring unit.

The first high-pass filter may have a transfer function of:

$$H1(z) = k1 \cdot [-z^{-2} + 2z^{-1} - 1]$$

where k1 is a constant. This filter processes three consecutive signal values of the input signal and makes available at the output a filtered value proportional to the difference between the middle of the three signal values and the mean of the other two signal values.

The second high-pass filter may have a transfer function of:

$$H2(z) = k2 \cdot [z^{-2} - 1]$$

where k2 is a constant. This high-pass filter processes three consecutive signal values and provides a filtered value proportional to a difference between the first and third of the three consecutive input signal values, this filtered signal value corresponding to the interval between the second and third signal values.

The coring unit may set at zero the input signal values that lie within an interval with boundaries determined by the control signal, while values smaller or larger than this interval are decreased or increased by the control signal value, regardless of whether the input signal value is larger than the upper interval boundary determined by the control signal value or smaller than the lower interval boundary determined by the control signal value.

When two such high-pass filters are used, the control signal, which represents the coring parameter of the coring unit, is dependent on the interval width between the second and third signal values. This control signal is applied to a signal from the first high-pass filter corresponding to the difference between the first signal value and the mean between the second and third signal values. A device, for example a limiter, may be connected between the output of the coring unit and the output of the filter device so that the output signal of the coring unit can be externally adjustably amplified or attenuated.

The high-pass filter device may be used in a low-pass filter arrangement, in which an input signal is combined by means of a switching circuit with the output signal of the high-pass filter device to form a low-pass filtered signal.

These and other objects, features and advantages of the present invention will become more apparent in light of the following detailed description of preferred embodiments thereof, as illustrated in the accompanying drawings.

BRIEF DESCRIPTION OF THE DRAWINGS

FIGS. 8A and 8B are graphs illustrating the input signal (FIG. 8A) and the output signal (FIG. 8B) of the low-pass filter arrangement of FIG. 7;

FIGS. 9A-9C are graphs illustrating an exemplary time diagram of the filter input signal of the filter of FIG. 7 (FIG. 9A), the filtered output signal in high-pass filtering of only every other (even) input value (FIG. 9B), and the filtered output signal in high-pass filtering of only every other (odd) input value (FIG. 9C);

DETAILED DESCRIPTION OF THE INVENTION

Figure 1:
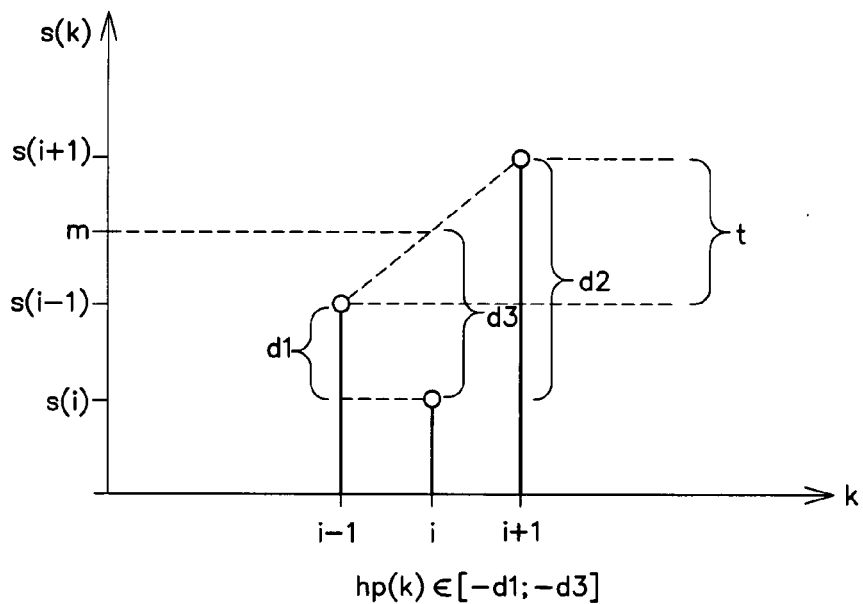
FIG. 1 is a graph illustrating three consecutive values of a signal to be filtered.
Figure 2:
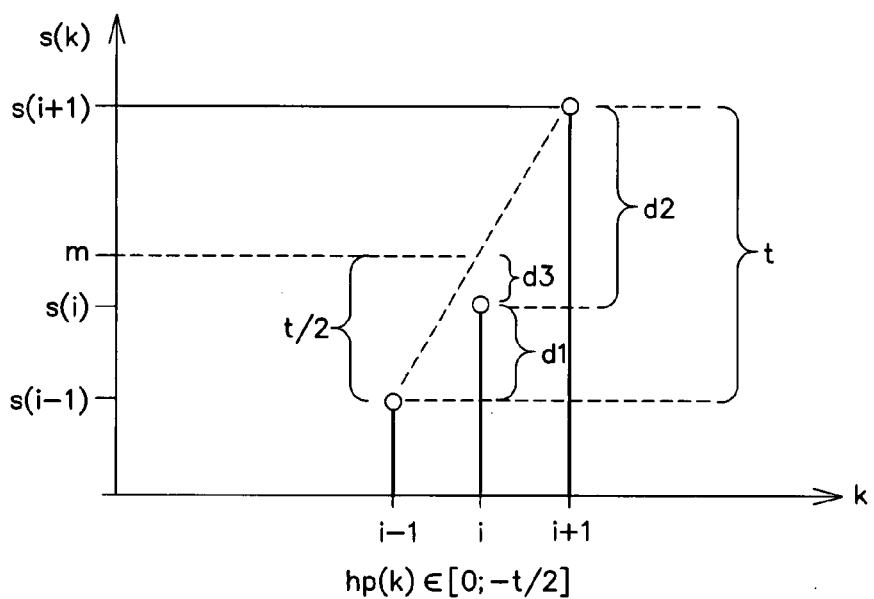
FIG. 2 is a graph illustrating three other consecutive values of a signal to be filtered.

Except as otherwise stated, like reference characters in the drawings identify like components with like meaning. Referring to FIGS. 1 and 2, the method for high-pass filtering of a signal s(k) to generate a filtered high-pass signal hp(k) is illustrated for the generation of a specific signal value hp(i) of the filtered signal hp(k). In the following, k designates the control variables of the signals s(k) and hp(k), and i designates any given element of these control variables.

The signal s(k) to be filtered may be any signal having a sequence of signal values, in particular a time-discrete signal, and thus may represent sample pulses of a time-continuous signal. The sequence of signal values s(k) may also represent a sequence of graphical information values, which are read out column-by-column or line-by-line from an image, such as that generated by the interlaced fields in a typical television picture.

In each iteration, the method selects a specific signal value of the signal s(k) to be filtered, as represented by the first signal value s(i) in FIGS. 1 and 2. Also selected is at least one second signal value preceding the selected first signal value s(i), represented by the signal value s(i−1), and at least one third signal value following the selected first signal value s(i), represented by the signal value s(i+1). The second and third signal values s(i−1), s(i+1) define an interval I=[s(i−1); s(i+1)], the interval width being designated as t in FIGS. 1 and 2. The mean value of the second and third signal values s(i−1), s(i+1) is also determined, being designated as m in FIGS. 1 and 2.

A determination is made whether the first signal value s(i) lies within the interval defined by the second and third signal values s(i−1), s(i+1). If the first signal value s(i) is outside the interval (FIG. 1), a first distance d1 is determined between the first signal value s(i) and the second signal value s(i−1), a second distance d2 is determined between the first signal value s(i) and the third signal value s(i+1), and a third distance d3 is determined between the first signal value s(i) and the middle of the interval or the mean value m. The filtered signal value hp(i) is then selected from an interval defined by the smaller of the first and second distance d1, d2 and the third distance d3. The sign of the filtered signal value hp(i) depends on the position of the first signal value s(i) relative to the mean value m, such that the sign of the filtered signal value hp(i) is minus when the first signal value s(i) is smaller than the mean value m (FIG. 1), and the sign of the filtered signal value hp(i) is plus when the first signal value s(i) is greater than the mean value m.

The selecting of the smaller of the first and second distances d1, d2 results in the magnitude of the filtered signal value hp(i) lying in an interval defined by the distance to the closest interval boundary and the distance to the middle of the interval. In the example of FIG. 1, the second signal value s(i−1) forms the closest interval boundary to the first signal value s(i).

Instead, if the first signal value s(i) lies within the interval, a signal value is selected for the filtered signal value hp(i) within a value range from zero to half the interval width t/2. The sign of the filtered signal value hp(i) is minus if the first signal value is smaller than the mean value m, and the sign of the filtered signal value hp(i) is plus if the first signal value s(i) is greater than the mean value m.

In the case when the second and third signal values s(i−1), s(i+1) are the same size, but the first signal value s(i) is greater or smaller than the second and third signal values s(i−1), s(i+1), a value may be output as the filtered signal value hp(i) whose magnitude corresponds to the difference between the first signal value s(i) and one of the other two signal values s(i−1), s(i+1), and whose sign is chosen depending on whether the first signal value s(i) is greater or smaller than the other two signal values s(i−1), s(i+1).

In the event that the first, second, and third signal values are the same size, the filtered signal value hp(i) may be set equal to zero.

To suppress noise during the high-pass filtering, the determined distance value for each of the first, the second, and/or the third distance values is set to zero if the determined distance value is smaller than a predetermined limit value. This is based on the fact that slight deviations between signals, for example between the first signal value and the closest interval boundary, usually result from noise factors which can be suppressed. The method may provide the filtered signal value hp(i) with a value whose magnitude corresponds to the distance between the first signal value s(i) and the closest interval boundary s(i−1), s(i+1) and whose sign is chosen depending on the position of the first signal value s(i) relative to the mean value m, if the first signal value s(i) lies outside the interval spanned by the second and third signal values. Moreover, the filtered signal value hp(i) may be set equal to zero if the first signal value s(i) lies within the interval defined by the second and third signal values s(i−1), s(i+1). Still further, the filtered signal value hp(i) may be set equal to zero if the first signal value s(i) corresponds to the second or third signal value s(i−1), s(i+1).

For purposes of explanation, it has been assumed thus far that the second and third signal values s(i−1), s(i+1) defining the interval come immediately before and immediately after, respectively, the particular first signal value s(i) in the signal sequence, and these second and third signal values form the boundaries of the interval that is considered when generating the filtered signal value hp(i).

However, the method also contemplates the selection of several second signal values preceding the particular first signal value s(i) and several third signal values following the particular first signal value s(i) and forming an interval between each of the second signal values and each of the third signal values and selecting the second signal value and the third signal value that define the largest interval, this second signal value and this third signal value then forming the boundaries of the interval considered thereafter.

Mathematically, the signal value hp(k) generated by the filtering method in the case when the first signal value s(i) lies outside the interval formed by the second and third signal values s(i−1), s(i+1), may be selected by forming the difference between the first signal value s(i) and the mean value m, and subtracting the magnitude of half the interval width from the resulting difference if the first signal value s(i) is larger than the upper interval boundary, and adding the magnitude of half the interval width to the resulting difference if the first signal value s(i) is smaller than the lower interval boundary. If s(i) lies above the upper interval boundary, the difference determined between the first signal value s(i) and the half-interval boundary is positive, and the value obtained by subtracting the half-interval width from this difference value is bounded at the bottom as far as zero. If s(i) lies below the lower interval boundary, the difference determined between the first signal value s(i) and the half-interval boundary is negative, and the value obtained by adding this difference value to the half-interval width is bounded at the top by zero. Also, both the difference and the half-interval width may be set to zero when the value determined for this difference or the half-interval width is smaller than a predetermined limit value.

Figure 3:
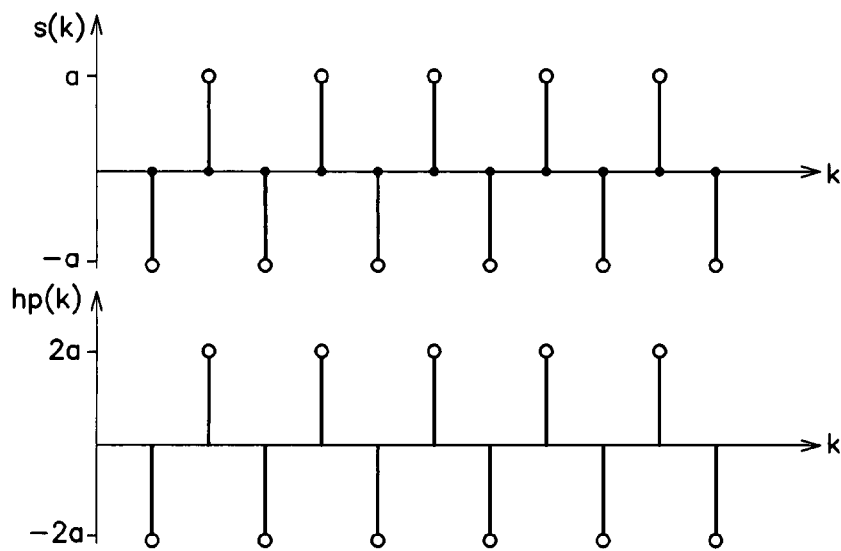
FIG. 3 is a graph illustrating an alternating signal to be filtered and the resulting filtered signal.

Referring to FIG. 3, the graphs illustrate the operation of the method when filtering an alternating signal s(k), which alternately takes on discrete signal values of −a and +a. For this situation, the particular filtered discrete value of the alternating signal s(k) may correspond to the distance to the closest interval boundary, if the first signal value lies outside the interval formed by the second and third signal values, and the particular filtered value of the alternating signal s(k) may be set to zero if the first signal value lies within the interval. The resulting high-pass filtered signal hp(k) is likewise an alternating signal that alternately takes on discrete negative signal values with an amplitude of −2a and discrete positive signal values with an amplitude of +2a. Thus, the high-pass filtered signal hp(k) corresponds to the input signal s(k) with twice the amplitude.

Figure 4A:
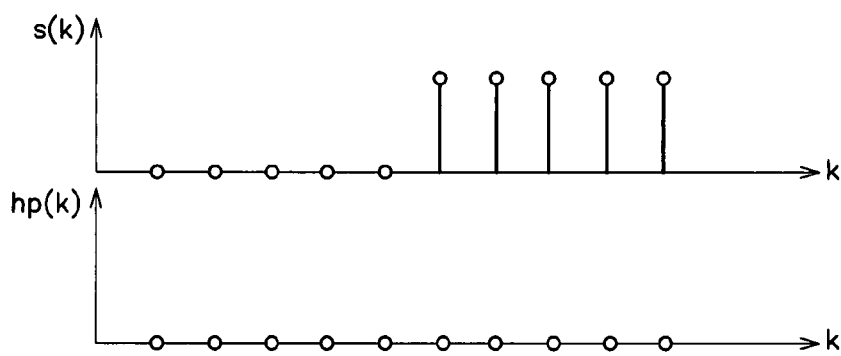
FIGS. 4A and 4B are graphs illustrating a step signal and the resulting filtered signal (FIG. 4A) and a pulse signal and the resulting filtered signal (FIG. 4B)

An advantage of the method is evident from FIG. 4A, in which a step signal s(k) to be filtered is represented. The step signal s(k) initially has a sequence of consecutive constant values (e.g., with zero amplitude), and later after an abrupt change has a sequence of signal values with constant amplitude not equal to (i.e., greater than) zero. The resulting high-pass filtered signal hp(k), which has been formed by determining for each value in the signal sequence s(k) the distance to the nearest interval boundary of an interval defined by the preceding and the following signal values, essentially ignores this step change increase and represents the constant amplitude signal s(k) with zero amplitude.

Figure 4B:
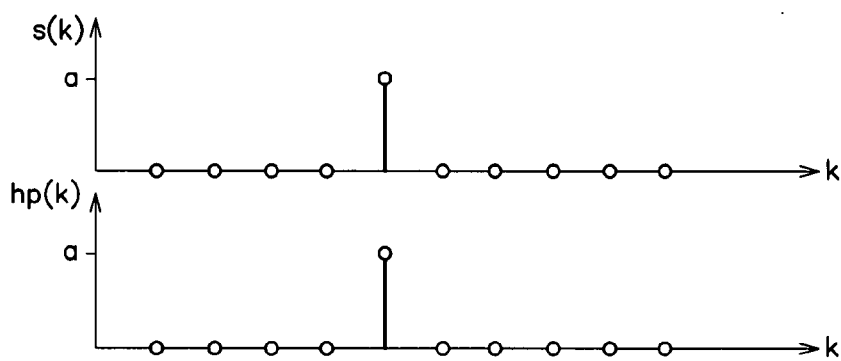

FIG. 4B is a graph that illustrates the high-pass filter method by means of a signal s(k) having a single pulse of amplitude a, wherein the resulting filtered signal hp(k) similarly contains a pulse of amplitude a.

Figure 5:
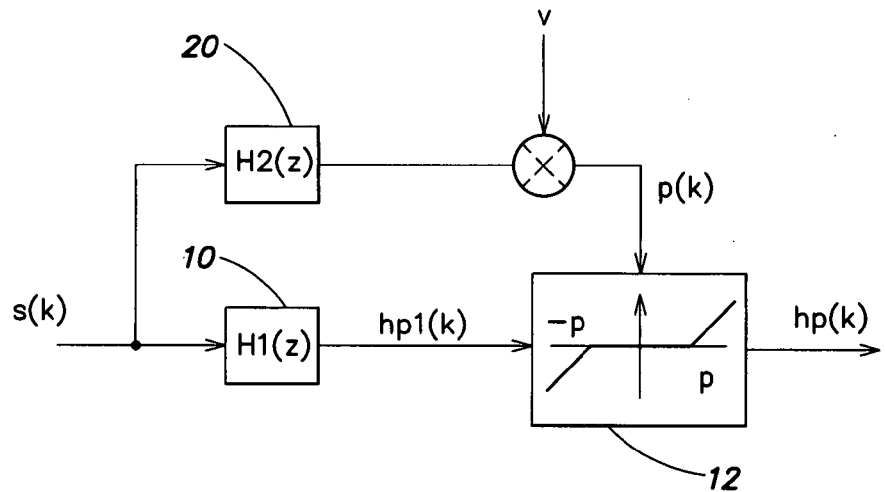
FIG. 5 is a block diagram of a high-pass filter device.

Referring to FIG. 5, there illustrated is an exemplary embodiment of a high-pass filter device for implementing the method. The high-pass filter device may include a first high-pass filter 10 with a transfer function $H1(z)$ and a second high-pass filter 20 with a transfer function $H2(z)$, each filter receiving the input signal s(k) for filtering. A coring unit 12, having both a signal input and a control input, is connected to the first and second filters 10, 20. The control input of the coring unit 12 receives an output signal p(k) from the second high-pass filter 20, and the signal input of the coring unit 12 receives an output signal hp1(k) from the first high-pass filter 10. The resulting high-pass filtered signal hp(k) is output from the coring unit. Optionally, the output signal p(k) of the second high-pass filter 20 may be made to form the absolute value before being fed to the coring unit 12.

The mode of operation of the coring unit 12 is known. An output signal value hp(i) from the coring unit 12 is zero if the input signal value hp1(i) lies within an interval defined by −p(i) and +p(i). If the input signal value hp1(i) is greater than +p(i), the output signal value hp(i) is the difference between the input signal value hp1(i) and the control signal value p(i). If the input signal value hp1(i) is less than −p(i), the output signal value hp(i) is the sum of the input signal value hp1(i) and the control signal value p(i).

The transfer function $H1(z)$ of the first high-pass filter 10 may be expressed as:

$$H1(z)=0.5\cdot[-z^{-2}+2\cdot z^{-1}-1]$$

In terms of the discrete input signal s(k), this means that a signal value hp1(i) at the output of the first high-pass filter 10 is proportional to a difference between a signal value s(i) and the mean value of the preceding signal value s(i−1) and following signal value s(i+1).

The transfer function $H2(z)$ of the second high-pass filter 20 may be expressed as:

$$H2(z)=0.5\cdot[1-z^{-2}]$$

In terms of the discrete input signal s(k), this means that the parameter control signal p(k) provided to the coring unit 12 represents each time, for a signal value s(i) of the discrete input signal s(k), the half-interval width of an interval defined by the preceding signal value s(i−1) and the following signal value s(i+1). The output signal hp(k) of the coring unit 12 may be subjected to amplification or damping before being output from the filter.

In this high-pass filter device, therefore, a value for the filter output signal hp(k) of zero is output if the difference between a signal value s(i) and the mean value of the neighboring signal values s(i−1), s(i+1) is less than the half-interval width, i.e., if this value s(i) lies within the interval defined by the neighboring signal values s(i−1), s(i+1). If the difference between the signal value s(i) and the mean value of the neighboring signal values s(i−1), s(i+1) is larger than the half-interval width represented by p(k), a filter signal value hp(k) is output that corresponds to the difference between the signal value s(i) and the mean value plus or minus the half-interval width, and which thus represents the distance between the signal value s(i) and the closest interval boundary of the interval defined by the neighboring signal values s(i−1), s(i+1).

An amplifier may optionally be connected to the output of the second high-pass filter 20. The amplifier multiplies the output signal of the second high-pass filter 20 with a gain factor v, and this gain factor v may be between zero and one. By means of this gain factor v, the amplitude of the high-pass filtered signal hp(k) can be varied. A gain factor of zero corresponds to the case where the coring unit 12 lets the signal present at the output of the first high-pass filter 10 pass through to the output unchanged, wherein the individual signal values in view of the above-mentioned transfer function of the first filter then correspond each time to the difference between a signal value s(i) and the mean value of the neighboring signal values s(i−1), s(i+1).

Figure 6:
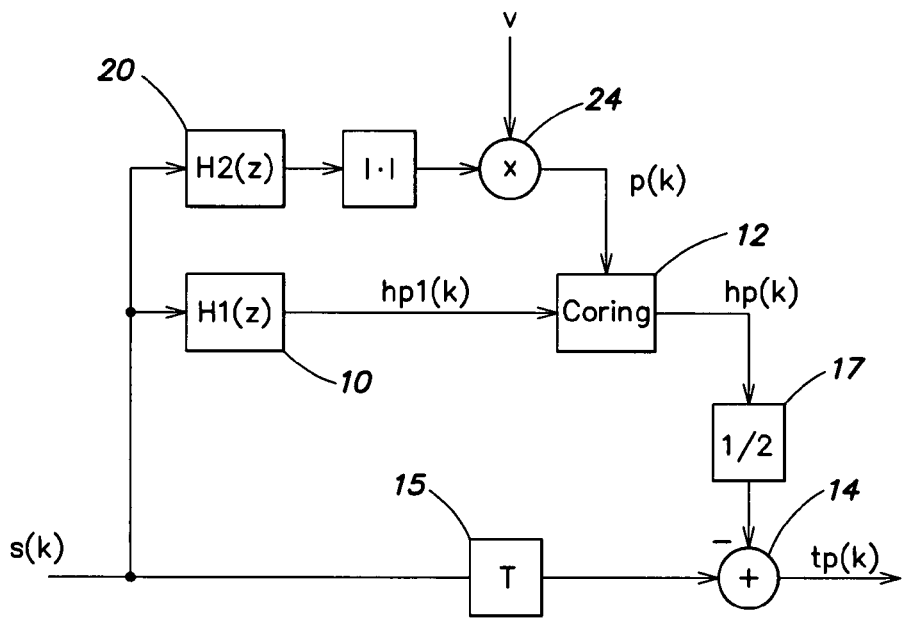
FIG. 6 is a block diagram of a low-pass filter arrangement having the high-pass filter device of FIG. 5.

The high-pass filter of FIG. 5 may be used in the low-pass filter arrangement of FIG. 6. This low-pass filter arrangement also includes a subtractor 14 whose noninverting input receives the input signal s(k) to be filtered and whose inverting input receives the high-pass filtered signal hp(k).

Also, a delay element 15 may be connected ahead of the noninverting input of the subtractor 14, to delay the signal s(k) to be filtered in accordance with the delays in the high-pass filter. The high-pass filtered signal hp(k) may be weighted by a weighting arrangement 17 having a multiplication factor of, e.g., 0.5 prior to the subtraction of the delayed input signal s(k).

Figure 7:
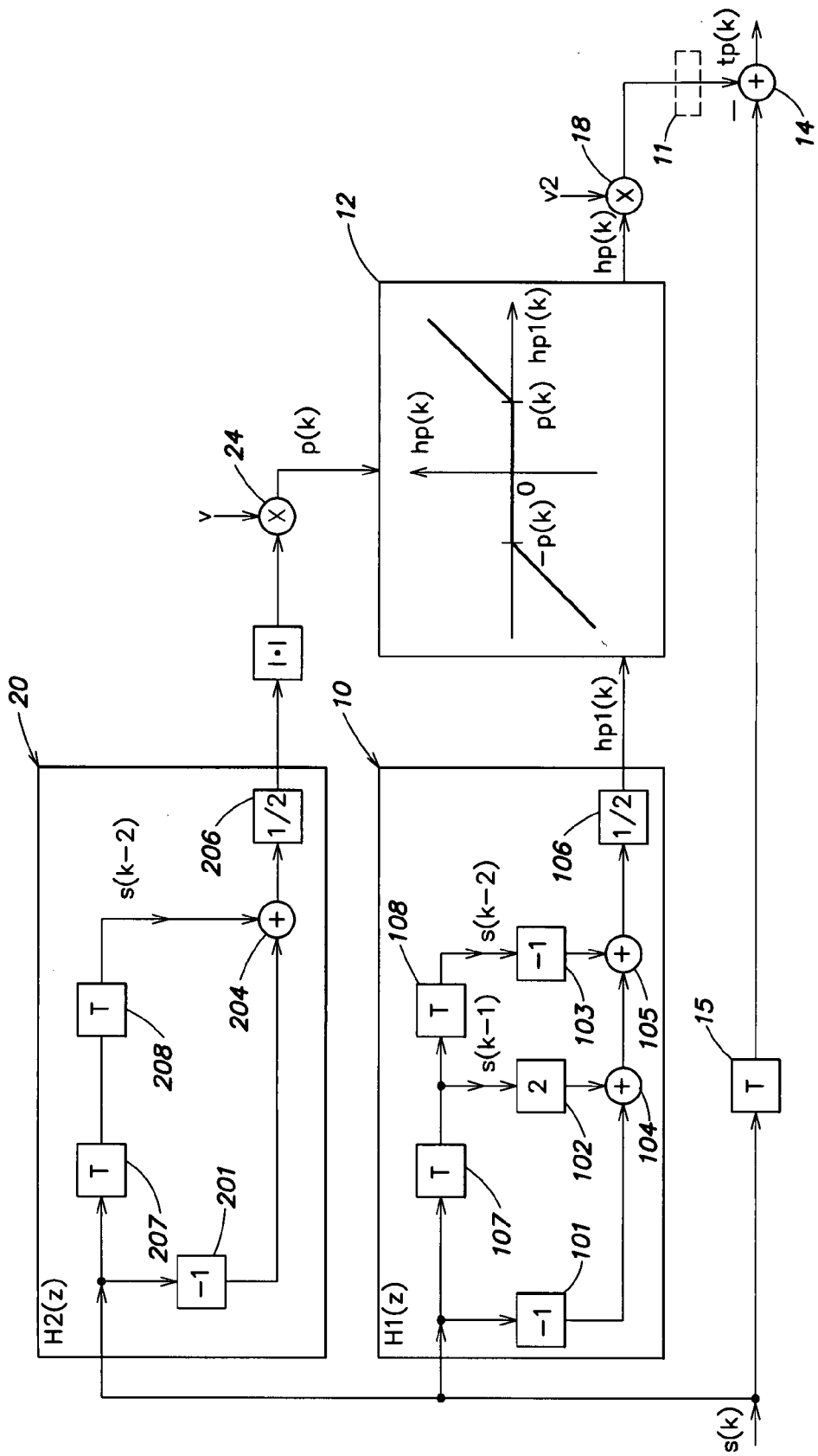
FIG. 7 is a block diagram of the low-pass filter arrangement of FIG. 6 with a more detailed block diagram of the high-pass filter device of FIGS. 5 and 6.

Referring to FIG. 7, there illustrated is the low-pass filter arrangement of FIG. 6 with the first and second high-pass filters 10, 20 illustrated in more detail. The first high-pass filter 10 may have a transfer function H1(z), similar to that of FIG. 5, expressed as:

$$H1(z)=0.5 \cdot [-z^{-2}+2z^{-1}-1]$$

and may be constructed as an FIR filter with a known non-recursive structure comprised of weighting elements 101, 102, 103, delay elements 107, 108, adders 104, 105, and an amplifier 106.

The second high-pass filter 20 may have the transfer function H2(z) referred to above with respect to FIG. 5, and may also be constructed as an FIR filter with a known non-recursive structure comprising weighting elements 201, 206, delay elements 207, 208, and an adder 204. The transfer function P(z) that defines the mapping of the input signal s(k) onto the signal p(k) supplied to the coring unit 12 in the frequency domain may be expressed as:

$$P(z)=v \cdot |0.5 \cdot (z^{-2}-1)|$$

where v is the gain factor of the amplifier 24 which may be set equal to 1.

The mode of operation of the coring unit 12 is illustrated by its transfer characteristic, making use of the signal p(k) at the control input of the coring unit 12. The signal p(k) results from the output signal of the second high-pass filter 20 by forming the magnitude and weighting thereof, by means of the output signal hp1(k) of the first high-pass filter 10, and by means of the high-pass filtered signal hp(k) at the output of the coring unit 12. The transfer characteristic illustrates that the output signal hp(k) is set at zero for values between −p(k) and +p(k), that it equals the difference of hp1(k) and p(k) for values larger than p(k), and that it equals the sum of hp1(k) and p(k) for values less than −p(k).

The graph of FIG. 8A illustrates one possible input signal s(k) fed to the low-pass filter arrangement of FIG. 7, while the graph of FIG. 8B illustrates the low-pass filtered signal tp(k) at the output of the filter of FIG. 7. For ease of understanding, various locations in the course of the input signal s(k) at which conspicuous changes in the signal occur for control variables k(0) to k(6) are highlighted in FIG. 8A. Corresponding control variables k(0) through k(6) are represented in the output signal of FIG. 8B, ignoring any signal delays in the low-pass filter, to emphasize the effects of the low-pass filtering at those locations with significant signal amplitude changes.

In FIG. 8A, the input signal s(k) is a step signal with a step from a lower amplitude level to an upper amplitude level at k3. Superimposed on this step signal is a positive pulse at k0 and a negative pulse at k4, as well as a high-frequency signal component between k1 and k2 and another between k5 and k6.

As seen in the graph of FIG. 8B of the low-pass filtered signal tp(k), the low-pass filter arrangement of FIG. 7 leaves the step at k3 unchanged, and also leaves unchanged the lower level and the upper level of the step function. This is because, as explained with respect to FIG. 4A, the high-pass filtered signal hp(k) has a signal value of zero both for constant values of the input signal s(k) and for a step in the input signal s(k) from a lower constant value to an upper constant value. The pulses at k0 and k4 remain essentially preserved, but are halved in amplitude as compared to a constant level, which represents the lower level of the step signal for the pulse at k0, and the upper level of the step signal for the pulse at k4. This is because, as explained above, the high-pass filter responds to a pulse with a pulse, and the pulse of the high-pass filtered signal hp(k) in FIG. 7 is subtracted from or added to the pulse of the input signal s(k) with a factor 0.5.

Optionally, the amplitude of the pulses remaining after the low-pass filtering tp(k) of FIG. 7 may be varied by weighting the high-pass filtered signal at the output of the coring unit 12 through use of the weighting arrangement 18 having a weighting factor v2 of between 0 and 1. For a weighting factor v2 of zero, the input signal s(k) is provided unchanged, only delayed, as the low-pass filtered signal tp(k). For a weighting factor v2 of 1, subtracted from the input signal s(k) is a high-pass filtered signal whose amplitude for pulses corresponds to the amplitude of the pulses of the input signal s(k), so that pulses in the low-pass filtered signal tp(k) are entirely attenuated. With a weighting factor v2 of 0.5, the amplitude of the pulses is cut in half.

Summarizing, the method for high-pass filtering leaves steps of the input signal s(k) unchanged, and by weighting the high-pass filtered signal hp(k) before subtraction from the input signal s(k) it is possible to adjust how much the pulses of the input signal s(k) should be damped in the low-pass filtered signal tp(k) at the output of the low-pass filter arrangement. As further illustrated in FIG. 8B, the high-frequency signal components are largely attenuated, and small pulses are only generated at the beginning and end of the high-frequency signal component.

FIG. 9A illustrates a similar graph to that of the input signal s(k) of FIG. 8A. The graphs of FIGS. 9B and 9C may be obtained by subtracting each time only every other high-pass filtered value present at the output of the coring unit 12 from the input signal s(k) in the filter arrangement of FIG. 7 to arrive at the filtered output signal tp(k). For this purpose, a sampling unit 11 may be provided, which is connected to the coring unit 12 and configured to set at zero every other output value hp(k), i.e., either the values with an even-numbered control variable k or the values with an odd-numbered control variable k. In this way, only every other value of the input signal s(k) is low-pass filtered, while the other values arrive unchanged, merely delayed in time, at the output tp(k). Depending on the application, however, the sampling pattern may be varied, for example, by setting at zero only every n-th output value hp(k) or letting through only the n-th value, where n is an integer value.

FIG. 9B illustrates the graph of the signal tp(k) obtained when only the values of hp(k) with even-numbered control variable k are low-pass filtered, where the pulses at k0 and k4 are not contained in this sampled signal subjected to the low-pass filtering, and thus are not considered in the high-pass filtering and are unchanged in the low-pass filtered signal tp(k). Further, this type of filtering creates an envelope for the high-frequency signal components between k1 and k2 and between k5 and k6.

FIG. 9C illustrates the graph of the signal tp(k) obtained where all input signal values s(k) with odd-numbered control variables k are low-pass filtered. The filtered signal values contain the pulses at k0 and k4, which are fully extinguished in the low-pass filtered signal tp(k), provided the gain factors are v=1 and v2=1, since the high-pass filtered signal hp(k) then contains the pulses at their full amplitude which are then subtracted from the input signal.

Figure 10:
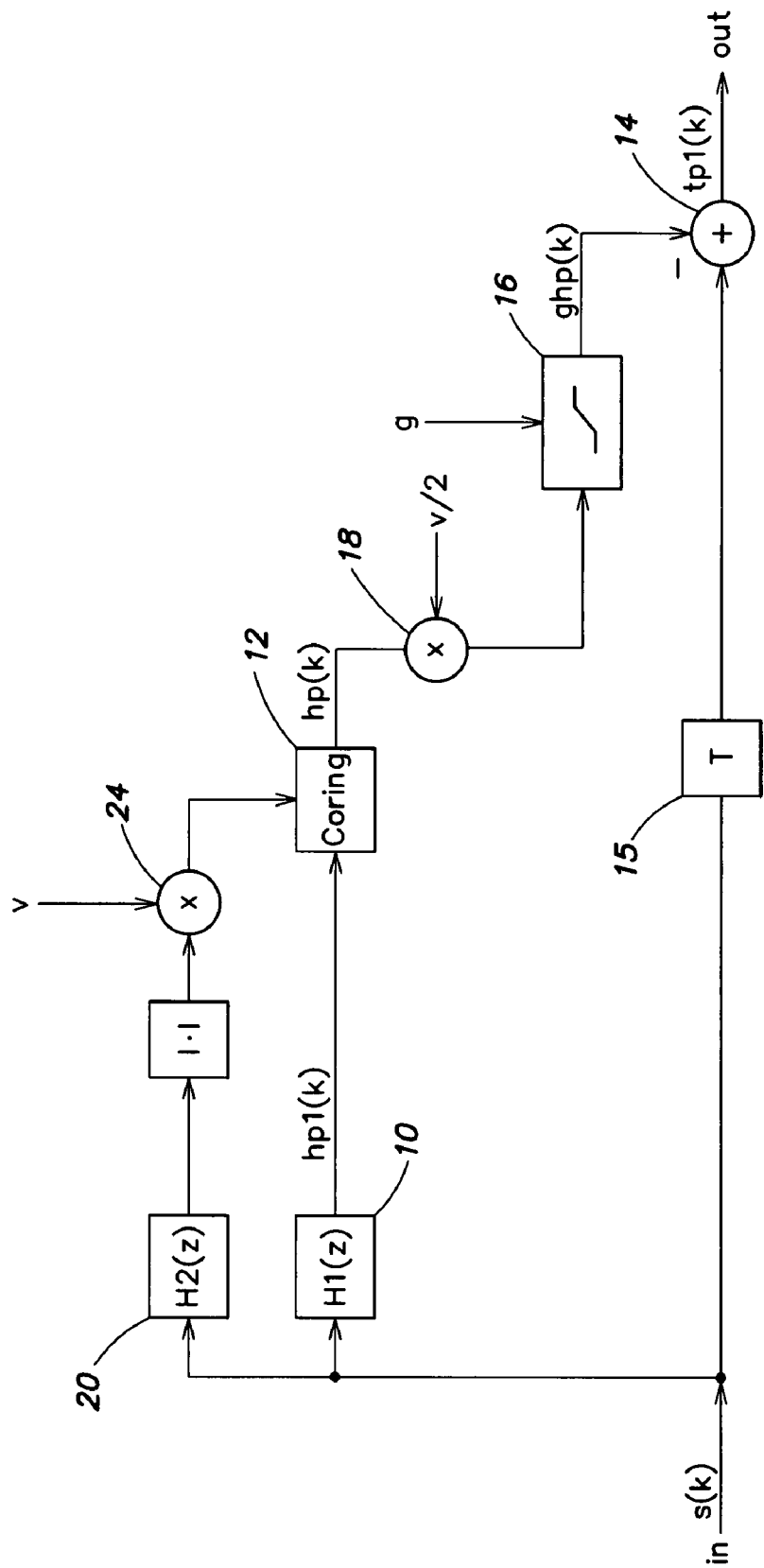
FIG. 10 is a block diagram of an alternative embodiment of a low-pass filter arrangement having a high-pass filter device.

Referring to FIG. 10, in an alternative embodiment of the low-pass filter arrangement with the high-pass filter device of FIGS. 6 and 7, the high-pass filtered signal hp(k) at the output of the high-pass filter device is limited by a limiter 16 before the high-pass filtered signal hp(k) is subtracted from the delayed input signal s(k). The high-pass filtered signal hp(k) in FIG. 10, and in FIGS. 11-13 explained below, corresponds to the output signal of the coring unit 12 if the optional weighting unit 18 is eliminated, and to the output signal of the coring unit 12 weighted with the factor v2 if the weighting unit 18 is present. The weighting value v2 lies between 0 and 1 and may be 0.5 when transfer functions H1(z), H2(z) defined above are used for the first and second high-pass filters 10, 20, respectively.

The limiter 16 limits the high-pass filtered signal hp(k) symmetrically to an upper limit value +g and a lower limit value −g, thereby creating a limited or bounded high-pass filtered signal. The limit value g may be externally adjustable via a control input of the limiter 16. At the limiter output is a signal ghp(k) that is subtracted from the delayed input signal s(k) to form the output signal tp1($k$) from the low-pass filter arrangement of FIG. 10. The limiter has the effect that the high-pass signal values ghp(k) subtracted from the input signal s(k) have a maximum amplitude g. High-pass signal components in the input signal s(k), whose amplitudes lie within the limiting region, are thus entirely low-pass filtered by the low-pass filter arrangement, while signal components whose amplitudes are larger than the limiting region are reduced in amplitude by the value of the limiting region. In particular, noise influences with low amplitude can be filtered out, although useful high-frequency signal components will also be influenced to a degree.

Figure 11:
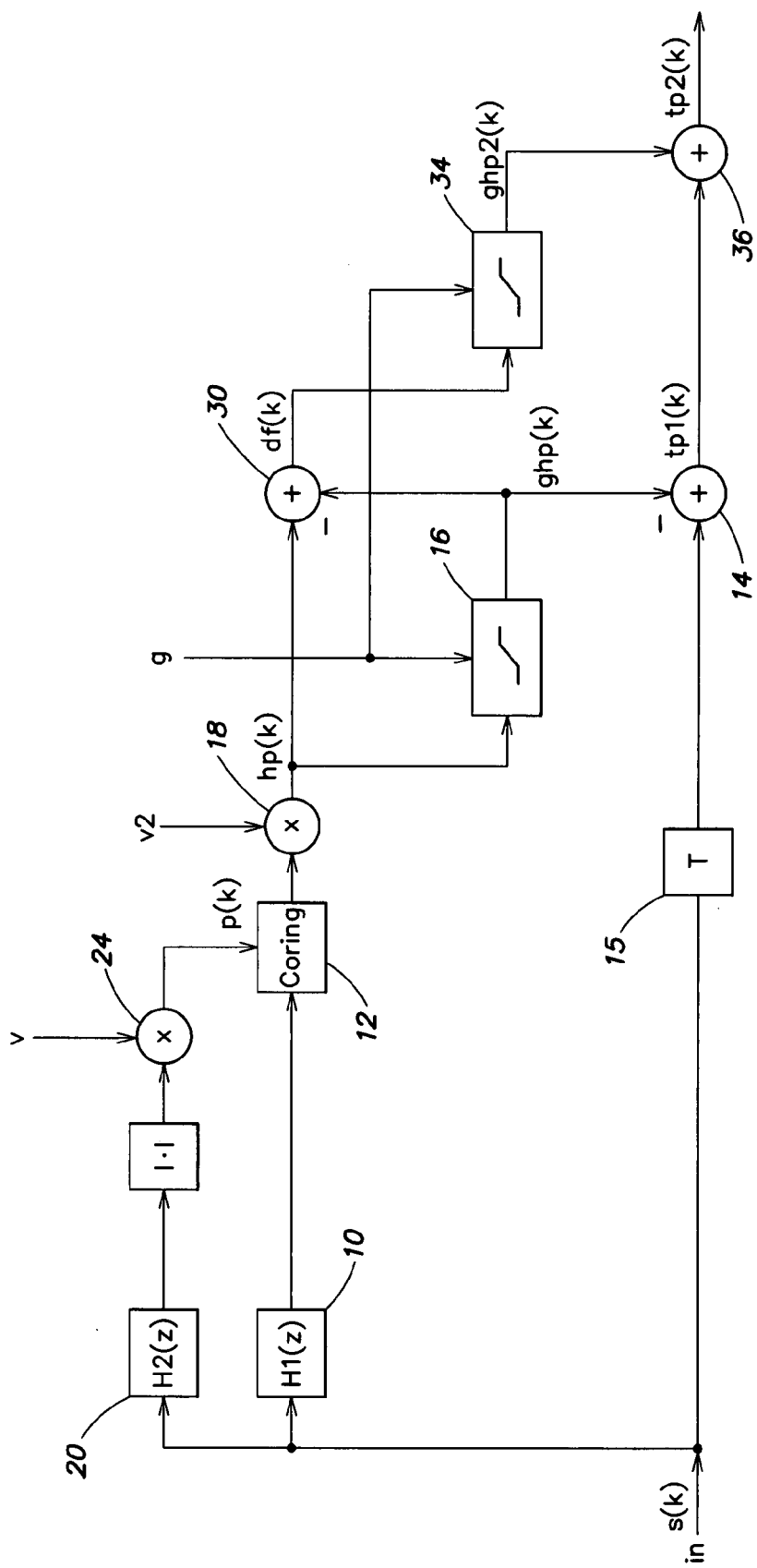
FIG. 11 is a block diagram of another alternative embodiment of a low-pass filter arrangement having a high-pass filter device.

Referring to the alternative embodiment of FIG. 11, the low-pass filter arrangement illustrated there differs from the filter arrangement of FIG. 10 in that the limited or bounded high-pass filtered signal ghp(k) is subtracted by a subtractor 30 from the high-pass filtered signal hp(k), to generate a difference signal df(k). This difference signal df(k) is provided to a second limiter 34, which receives the limit value g and similarly symmetrically limits the difference signal df(k) to the upper and lower limit values of +g and −g, respectively, to thereby generate a bounded difference signal ghp2($k$). The bounded difference signal ghp2($k$) is then added by the adder 36 to the low-pass filtered signal tp1($k$) to generate a low-pass filtered signal tp2($k$) output from the low-pass filter arrangement of FIG. 11.

As mentioned above in connection with FIG. 10, high-frequency signal components smaller than the limiting region are subtracted from the input signal s(k) and thus low-pass filtered, but useful high-frequency signal components will also be reduced in amplitude to a degree. This attenuation of the useful signal is undesirable in applications whose objective is to filter out only high-frequency noise signal components down to a particular amplitude.

In the low-pass filter arrangement of FIG. 11, for high-frequency signal components larger than the limiting region, a correction signal ghp2($k$) is added by the adder 36 to the low-pass filtered signal tp1($k$). To achieve this, the difference signal df(k) is first produced, this signal df(k) being zero as long as the amplitude of the signal hp(k) is smaller than the limiting value g. For amplitudes of hp(k) larger than the limiting value g, the amplitudes of the difference signal df(k) will be larger than zero. To avoid adding high-frequency signal components whose amplitudes are larger than the amplitudes of these signal components in the input signal s(k) to the signal tp1($k$), the amplitude of the difference signal df(k) is limited by the second limiter 34. The result is an overall behavior of the low-pass filter arrangement of FIG. 11 that can be described as follows: low-pass filtering is done for high-frequency signal components smaller than the limiting region; no change occurs for high-frequency signal components larger than twice the limiting region; and for high-frequency signal components larger than the limiting region and smaller than twice the limiting region, there is a gradual transition from low-pass filtering to an uninfluenced passage of the signal.

Figure 12:
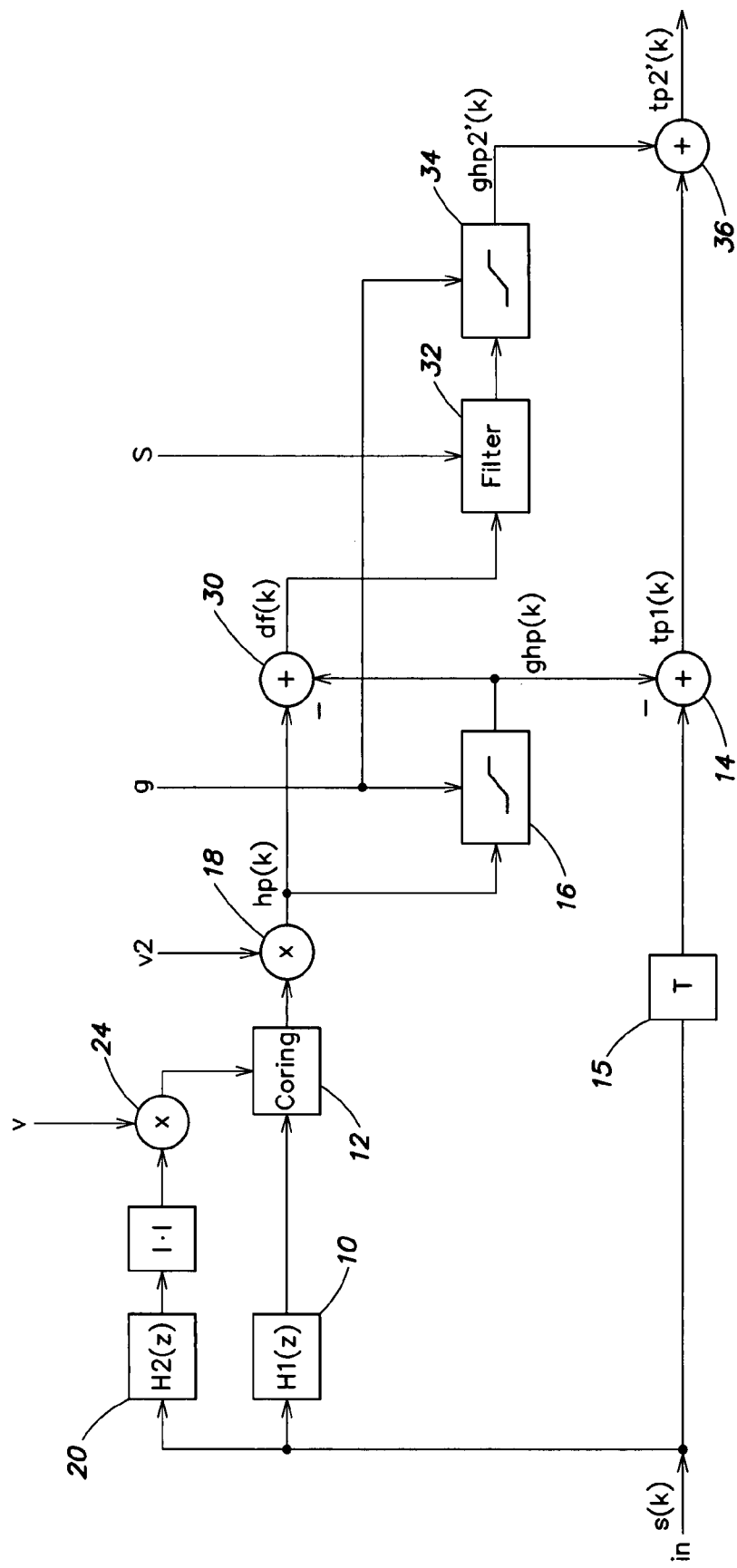
FIG. 12 is a block diagram of still another alternative embodiment of a low-pass filter arrangement having a high-pass filter device.

Referring to the alternative embodiment of FIG. 12, a low-pass filter arrangement differs from the low-pass filter arrangement of FIG. 11 in that a filter 32 for filtering the difference signal df(k) is connected ahead of the second limiter 34. The transfer function of this filter 32 can be externally adjusted by value s. The output of the second limiter 34 is a high-pass filtered signal ghp2'($k$), which is added to the low-pass filtered output signal tp1($k$) from the subtractor 14. The output of the low-pass filter arrangement of FIG. 12 is a low-pass filtered signal tp2'($k$).

The filter 32 makes it possible to organize the above-mentioned gradual transition range between low-pass filtering of the high-frequency signal components and their uninfluenced passage. This transition range can become narrower if the filter 32 has an amplifying nature with a gain factor larger than one, since limiting will then occur already for small values of the difference signal df(k). This transition region can also become broader if the filter 32 has an amplifying nature with a gain factor less than one, since then limiting will occur only for large values of the difference signal df(k). The filter 32 may have a transfer function that damps small values of the difference signal df(k), amplifies medium values, and again damps large values—values that are only somewhat smaller than the limiting value, to organize a smooth transition between the low-pass behavior and the free passage behavior. The filter can contain a reference table whereby the individual gain factors are assigned to the amplitudes of the difference signal df(k).

Figure 13:
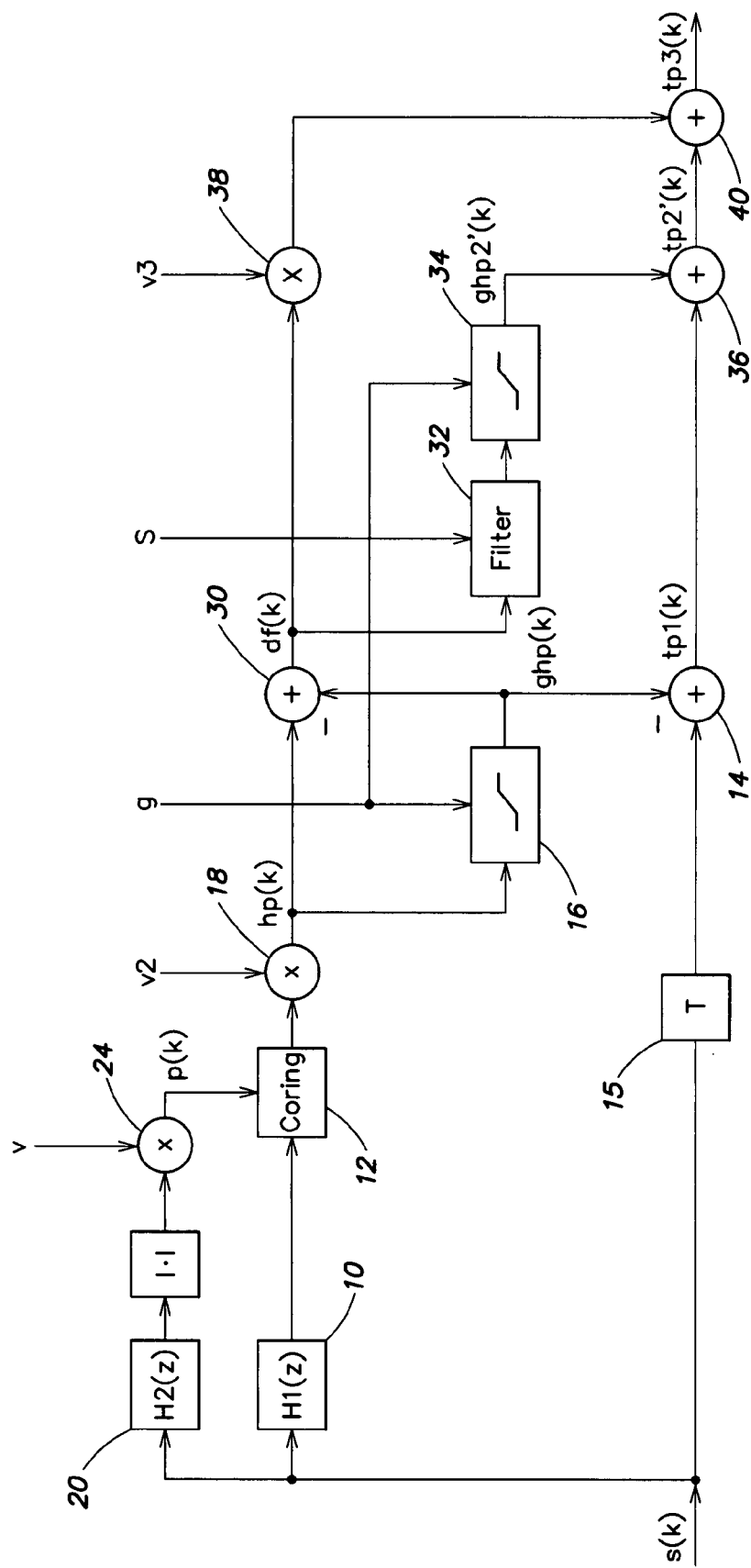
FIG. 13 is a block diagram of yet another alternative embodiment of a low-pass filter having a high-pass filter device.

Referring to the alternative embodiment of FIG. 13, a low-pass filter arrangement differs from that of FIG. 12 in that, besides the filter 32 and the second limiter 34, the difference signal df(k) is weighted with an adjustable weighting factor v3 by the weighting unit 38, and a signal output from the weighting unit 38 is added by a second adder 40 to the output signal tp2'(k) of the first adder 36.

Figure 14A:
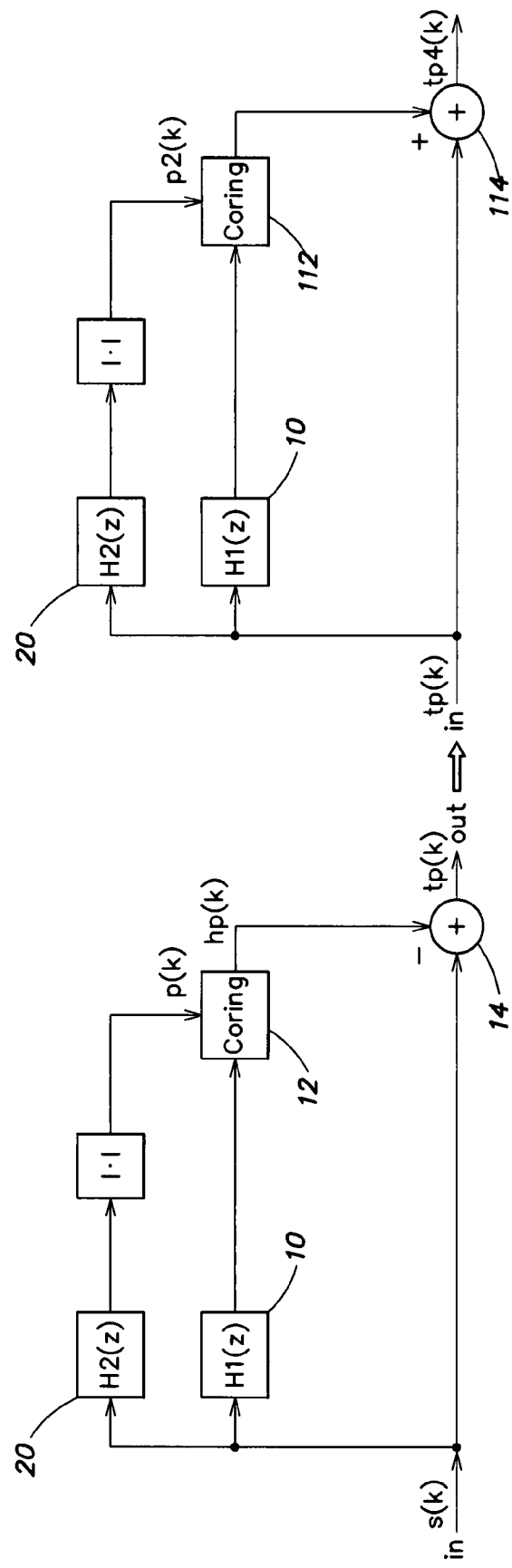
FIG. 14 is a block diagram of a filter system with a consecutive switching of a low-pass filter and a high-pass filter (FIG. 14A), and exemplary time diagrams of several signals occurring in the system (FIGS. 14B-14D)

As explained above, low-pass filtering with the filter arrangements of FIGS. 6, 7, and 10-13 has the drawback that pulses of the input signal s(k) are damped in amplitude depending on a weighting factor whereby the high-pass filtered signal hp(k) is weighted before subtraction from the input signal. With reference to FIG. 14A, this drawback can be eliminated by connecting the first low-pass filter arrangement with a high-pass filter to another low-pass filter arrangement downstream, which likewise has a similar high-pass filter. The second low-pass filter arrangement, whose input receives the output signal tp(k) of the first filter arrangement, differs from the first filter arrangement in that the signal present at the output of the high-pass filter (i.e., at the output of the coring unit 112) is added to the input signal tp(k) by the adder 114, to provide a filter output signal tp4($k$). While the first low-pass filter arrangement cuts in half the amplitude of pulses of the input signal s(k), as seen by comparing the input signal s(k) and the output signal tp(k) from the first filter arrangement in FIGS. 14B and 14C, these pulses are again filtered out in the second low-pass filter arrangement by the high-pass filter, yet they are added to the input signal to restore once again the pulses with their original amplitude in the resulting filter signal tp4(k), as seen in FIG. 14D.

Figure 19A:
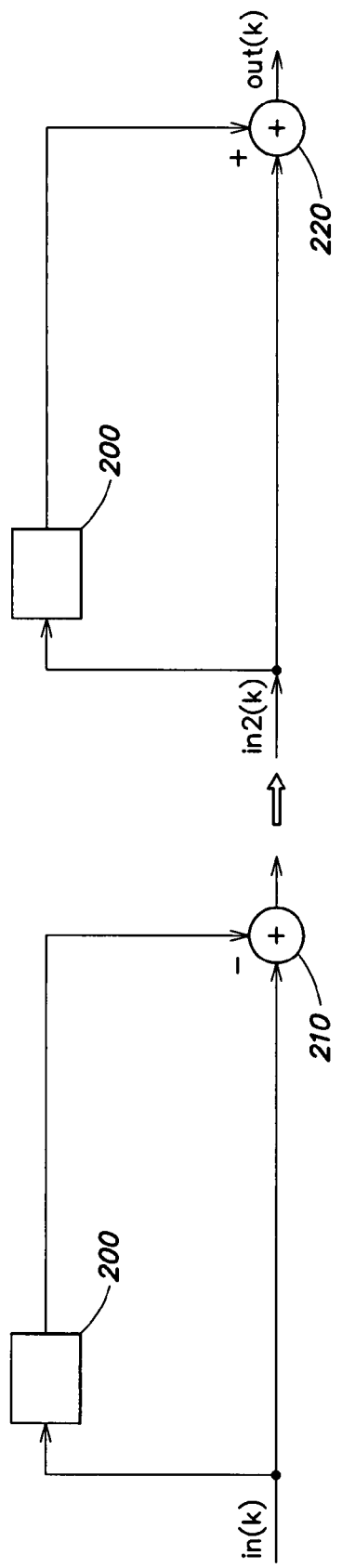
FIG. 19 is a block diagram of a prior art filter system with a series connection of a low-pass filter and a high-pass filter, and exemplary time diagrams of several signals occurring in the system (FIGS. 19B-19D).

The improvement in the transfer function of the system of FIG. 14 with the first low-pass filter arrangement, which filters out the high-frequency signal components, and the second low-pass filter arrangement, which amplifies high-frequency signal components contained in the output signal of the first filter arrangement, is seen in FIG. 19. FIG. 19A illustrates a prior art system constructed in accordance with the system in FIG. 14A, where traditional high-pass filters 200 are used instead of the high-pass filter devices of FIG. 14A arrangements according to the invention. The adders 210, 220 of the system of FIG. 19A correspond to the adders 14, 114 of the system of FIG. 14A. The system of FIG. 19A receives an input signal in(k), which corresponds to the signal s(k) in FIG. 14A. The transfer function of the high-pass filter 200 corresponds to the transfer function of the high-pass filter 10. A comparison of the output signals out(k) in the prior art system and tp4(k) in the system of FIG. 14A illustrates that edges in the signal diagram remain fully intact in the system of FIG. 14A, whereas they are flattened out in the prior art. Also, pulses remain intact in the system of FIG. 14A, whereas they are reduced in amplitude in the prior art system.

To summarize, the high-pass filter method and device described and illustrated herein with an adaptively adjustable coring unit has diversified applications, and that the high-pass filter has advantages over traditional linear high-pass filters, especially when filtering step signals.

For the discussion herein of the method, it has been assumed thus far that the input signal values processed came from a signal sequence with signal values consecutive in time or space, generating an output value for every input value by using neighboring values of the input signal. Then, depending on the specific configuration of the method, the signal sequence at the output represents a high-pass filtered or low-pass filtered input sequence.

However, the method is not limited to the processing of signal sequences with consecutive signal values in time or space, but may also be applied to otherwise generated signal values, as explained hereinbelow, where the first signal value S1 replaces the former first signal value s(i), the second signal value S2 replaces the former second signal value s(i−1), and the third signal value S3 replaces the former third signal value s(i+1).

Figure 15:
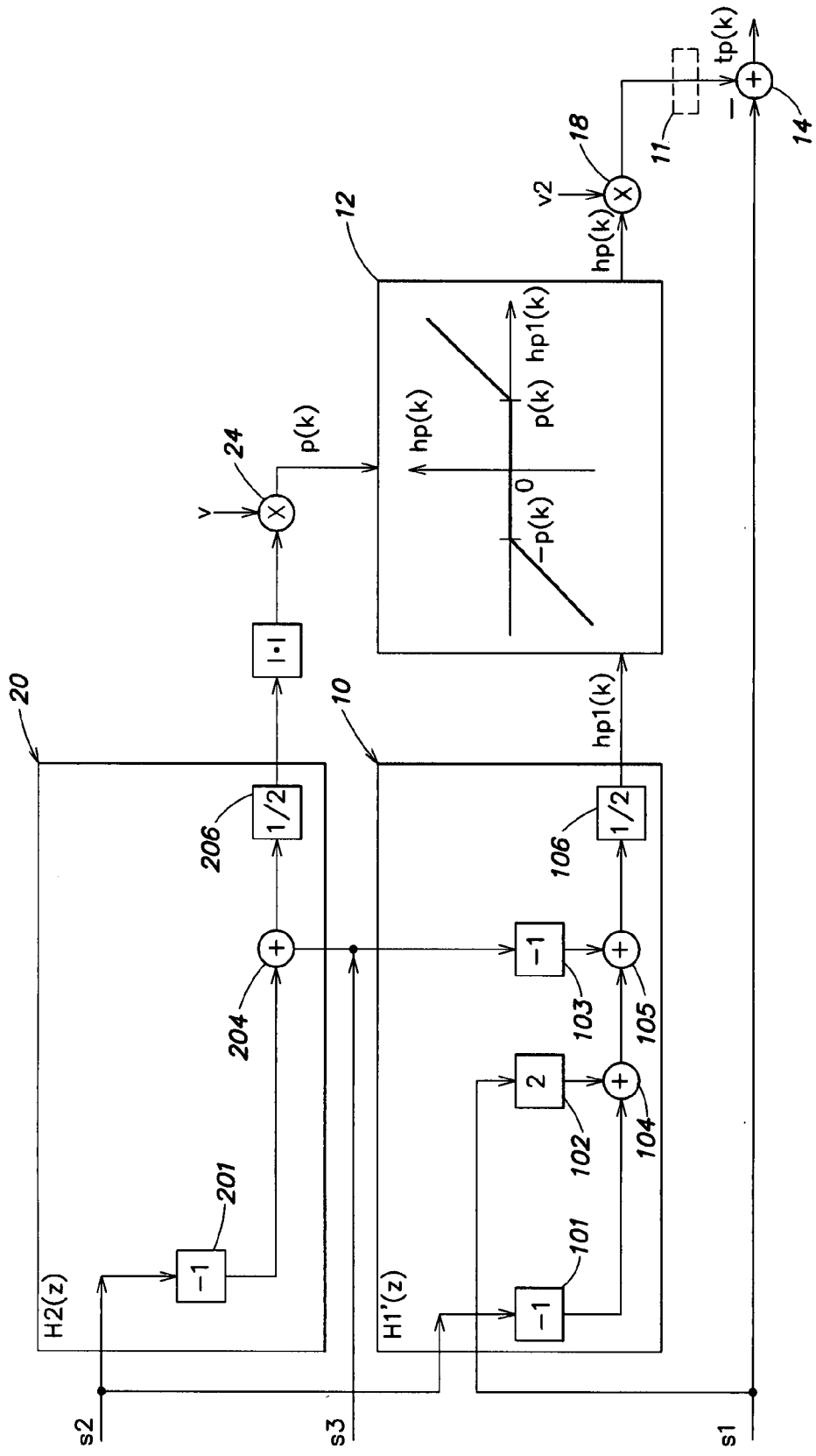
FIG. 15 is a block diagram of a modification of the low-pass filter arrangement of FIG. 7.

Referring to FIG. 15, there illustrated is a modification of the low-pass filter arrangement of FIG. 7. The arrangement of FIG. 7 applies the method to an input sequence s(k) of consecutive signal values, wherein the high-pass filter devices 10, 20 contain delay elements 107, 108, 207, 208, to process three consecutive signal values and provide a filter output value hp(k) or tp(k). In the arrangement of FIG. 15, these delay elements are eliminated and instead a first signal value S1, a second signal value S2, and a third signal value S3 are furnished in parallel to the device.

Based on the fact that, in FIG. 7, an instantaneous input value s(k), an input value delayed by 1 or s(k−1), and an input value delayed by 2 or s(k−2), is processed at the same time by the two filters 10, 20, in FIG. 15 the processing of the first signal value S1 corresponds to the processing of the signal value s(k−1) in FIG. 7, the processing of the second signal value S2 corresponds to the processing of the signal value s(k), and the processing of the third signal value S3 corresponds to the processing of the signal value s(k−2).

The arrangement of FIG. 15 determines, from these three values S1, S2, S3, an output signal hp(k) at the output of the coring unit 12 or a filter output value tp(k) at the output of the subtractor 14. The output signal value hp(k) corresponds to a measure of the mutual distance of signal values S1, S2, S3. The filter value tp(k), which subtracts the output value hp(k) of the coring unit 12 from the first signal value S1, corresponds to an interpolation value generated from the first, the second, and the third signal value S1, S2, S3.

The arrangement of FIG. 15 or the underlying method, which furnishes an interpolated value tp(k) from three signal values S1, S2, S3, is especially suitable for pixel interpolation, as will be explained hereinbelow with reference to FIGS. 16 and 17.

Figure 16:
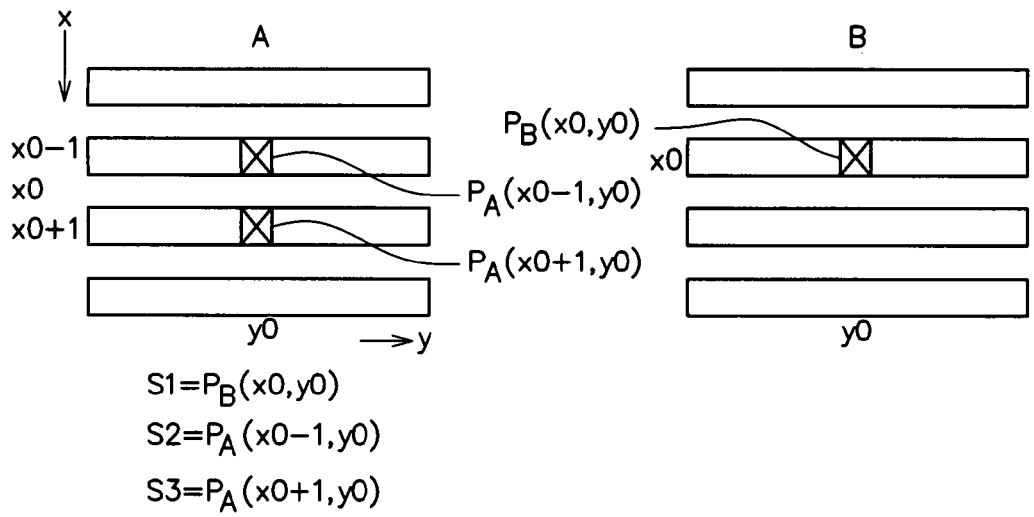
FIG. 16 is a schematic representation of a field sequence regarding application of the method to a pixel interpolation.

FIG. 16 illustrates two consecutive interlaced fields A, B of a field sequence, wherein field A, for example, comprises the even-numbered lines and field B the odd-numbered lines of the image. To interpolate a video information value for the pixel at position (x0, y0) in field A, one will use the video information values of three pixels, which are designated in FIG. 16 as $P_A(x0-1, y0)$, $P_A(x0+1, y0)$ and $P_B(x0, y0)$. The first signal value S1 corresponds to the video information value $P_B(x0, y0)$ at position (x0, y0) in the second field B. The second and third signal values S2, S3 come from the first field A and are the pixels neighboring the pixel (x0, y0) being interpolated in the vertical direction. Specifically, the second video information value S2 corresponds to the value of the pixel $P_A(x0-1, y0)$ lying above the pixel being interpolated, and the third pixel S3 corresponds to the value of the pixel $P_A(x0-1, y0)$ lying below the pixel being interpolated.

If the three signal values S1, S2, S3 are provided to the arrangement of FIG. 15, or the previously explained low-pass filter method is applied to these three signal values, the signal value tp(k) furnished at the output corresponds to the video information value $P_A(x0, y0)$ of the pixel interpolated in field A.

Figure 17:
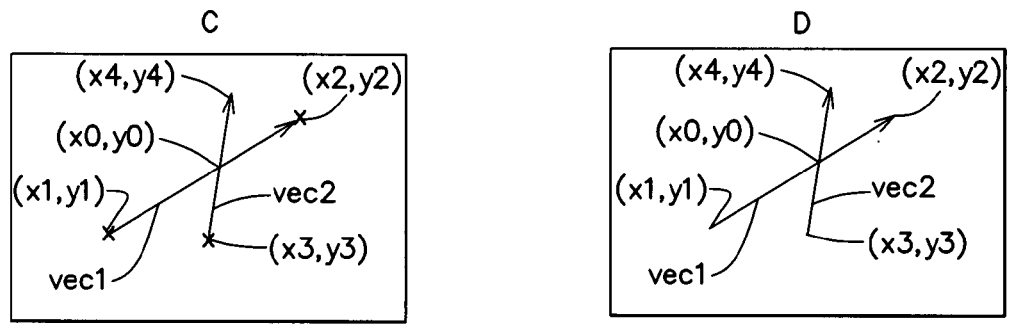
FIG. 17 is a schematic representation of an image sequence and an intermediate image to be interpolated by use of motion vectors to explain the application of the method to a pixel interpolation assisted by motion vectors.
Figure 17:
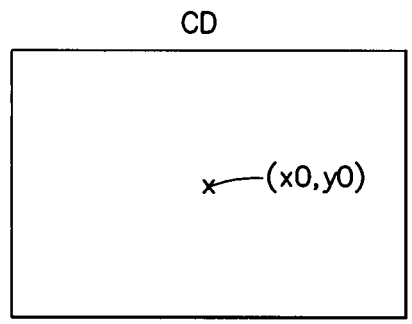
Figure 18A:
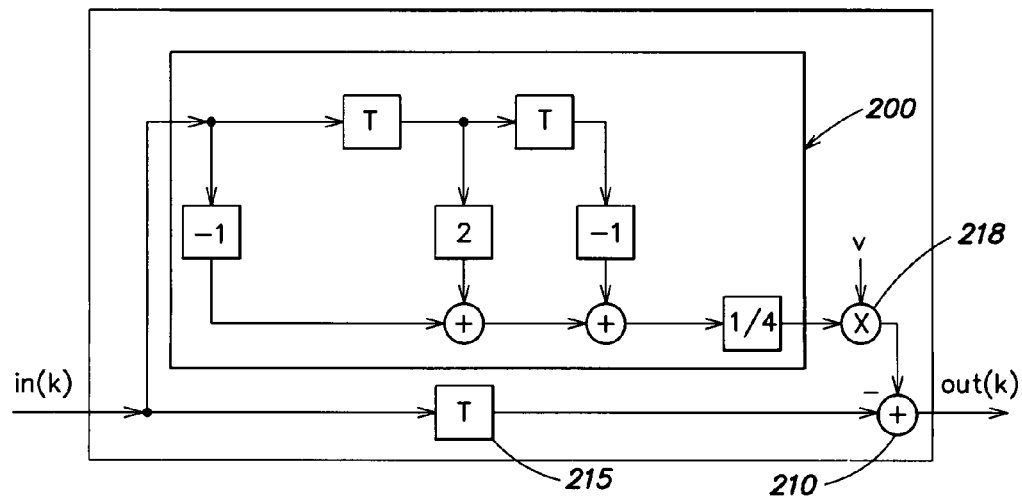
FIG. 18 is a block diagram of a prior art low-pass filter arrangement having a high-pass filter (FIG. 15A), along with an exemplary filter input signal (FIG. 18B) and a corresponding filtered output signal (FIG. 18C)
Figure 18B:
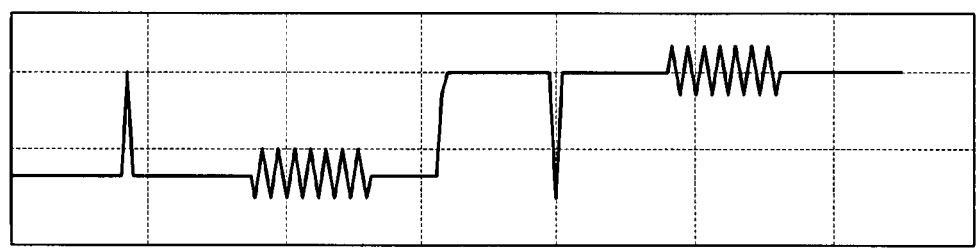
Figure 18C:

Referring to FIG. 17, there illustrated are two consecutive images C, D, for which an intermediate image CD lying between these two images in time or space is interpolated using motion vectors. The position designated as (x0, y0) in the image CD being interpolated is the position of the pixel being interpolated. This pixel is assigned two motion vectors vec1, vec2, whose spatial orientation is represented in images C, D. Pixel x0, y0 lies on these motion vectors. To interpolate pixel $P_{CD}(x0, y0)$, one will use the video information values $P_C(x1, y1)$, $P_C(x3, y3)$ at the starting points (x1, y1), (x3, y3) of the first and second motion vector vec1, vec2 in the first image C, and the video information values $P_D(x2, y2)$, $P_D(x4, y4)$ at the end points (x2, y2), (x4, y4) of the first and second motion vector vec1, vec2 in the second image D. The first signal value S1 to be processed corresponds to a mixed value of the video information value at the starting point of the first vector vec1 in the first image C and at the end point of this first vector vec1 in the second image D, while the mixed value is preferably the mean value, as expressed by:

$$S1=(P_C(x1,y1)+P_D(x2,y2))/2$$

The second signal value S2 being processed corresponds to the video information value $P_C(x3, y3)$ at the starting point of the second vector vec2 in the first image C, while the third signal value S3 being processed corresponds to the video information value $P_D(x4, y4)$ at the end point (x4, y4) of the second vector vec2 in the second image D.

If these signal values S1, S2, S3 are provided to the arrangement of FIG. 15, or the previously explained low-pass filter method is applied to these signal values, the signal value produced tp(k) corresponds to the video information value of the interpolated pixel $P_{CD}(x0, y0)$.

Although the application of the method to pixel interpolation is explained by means of a modification of the device of FIG. 7, it should be understood that any of the low-pass filter methods explained herein are applicable to pixel interpolation, provided at least three processed signal values are furnished as explained with reference to FIGS. 16 and 17.

Although the present invention has been shown and described with respect to several preferred embodiments thereof, various changes, omissions and additions to the form and detail thereof, may be made therein, without departing from the spirit and scope of the invention.

What is claimed is:

1. A method for filtering video input signal having a sequence of signal values, to provide a high-pass filtered video output signal having a sequence of filtered signal values for video display, the method comprising the following steps:
    a) selecting a first signal value of the video input signal to be filtered and at least one second signal value preceding the first signal value in the video input signal sequence and at least one third signal value following the first signal value in the video input signal sequence;
    b) determining an interval defined by the at least one second signal value and the at least one third signal value, with a first interval boundary defined by the at least one second signal value and a second interval boundary defined by the at least one third signal value;
    c) determining a mean value of the interval from the at least one selected second signal value and the at least one selected third signal value;
    d) determining whether the first signal value lies within the interval;
    e) if the first signal value lies outside the interval, determining a first distance between the first signal value and the first interval boundary and a second distance between the first signal value and the second interval boundary and a third distance between the first signal value and the mean value to provide a first, a second, and a third distance value, and selecting a signal value from a value range between the smaller of the first and second distance values and the third distance value to provide the selected signal value;
    f) if the first signal value lies within the interval, selecting a signal value from a value range between zero and half the interval width to provide the selected signal value; and
    g) setting the sign of the selected signal value depending on the position of the first signal value relative to the mean value to provide a value for the high-pass filtered video output signal.

2. The method of claim 1, further comprising the step of weighting the selected signal value.

3. The method of claim 1, where the smaller of the first and second distance values is selected as the selected signal value in step e), and zero is selected as the selected signal value in step f).

4. The method of claim 1, where the step of setting the sign of the selected signal value sets the sign of the selected signal value as plus if the first signal value is larger than the mean value, and sets the sign of the selected signal value as minus if the first signal value is smaller than the mean value.

5. The method of claim 1, further comprising the steps of setting the first distance value to zero if the first distance value is determined to be smaller than a predetermined limit value, setting the second distance value to zero if the second distance value is determined to be smaller than a predetermined limit value, and setting the third distance value to zero if the third distance value is determined to be smaller than a predetermined limit value.

6. The method of claim 1, further comprising the step of limiting the filtered signal value to an upper limit value and a lower limit value.

7. The method of claim 1, where a plurality of second signal values each preceding the first signal value in the sequence is selected, and where a plurality of third signal values each following the first signal value in the sequence is selected, where one of the plurality of the second signal values is selected as the second signal value and one of the plurality of the third signal values is selected as the third signal value.

8. The method of claim 7, where a distance is determined between each of the plurality of the second signal values and each of the plurality of the third signal values, and the second signal value and the third signal value having the greatest distance therebetween are selected to define the first and second interval boundaries.

9. The method of claim 7, where a distance is determined between each of the plurality of the second signal values and each of the plurality of the third signal values, and the second signal value and the third signal value having the smallest distance therebetween are selected to define the first and second interval boundaries.

10. The method of claim 1, further comprising the step of generating a low-pass filtered video output signal from the high-pass filtered video output signal and the video input signal.

11. The method of claim 10, where the step of generating the low-pass filtered video output signal comprises the step of subtracting the high-pass filtered video output signal from the video input signal.

12. The method of claim 11, further comprising the step of amplifying the high-pass filtered video output signal prior to the step of subtracting the high-pass filtered video output signal from the video input signal.

13. The method of claim 10, where the step of generating the low-pass filtered video output signal comprises the following steps:
    limiting the high-pass filtered video output signal to generate a limited high-pass filtered signal;
    subtracting the limited high-pass filtered signal from the video input signal to generate a first low-pass filtered signal;
    subtracting the limited high-pass filtered signal from the high-pass filtered signal to generate a difference signal;
    limiting the difference signal to generate a limited difference signal; and
    adding the first low-pass filtered signal and the limited difference signal to generate the low-pass filtered video output signal.

14. The method of claim 13, further comprising the step of filtering the difference signal prior to the step of limiting the difference signal to generate a limited difference signal.

15. The method of claim 14, in which the step of filtering the difference signal comprises the step of amplifying the difference signal with a gain factor depending on an amplitude of the difference signal.

16. The method of claim 14, further comprising the steps of:
    weighting the difference signal to generate a weighted difference signal;

adding the first low-pass filtered signal to the limited difference signal to generate a second low-pass filtered video output signal; and adding the second low-pass filtered video signal to the weighted difference signal to generate the low-pass filtered video output signal.

17. A video filter device, which filters a video input signal having a sequence of signal values, and which provides a high-pass filtered video output signal having a sequence of filtered signal values for video display, comprising:

an input connected to the input signal, and an output that provides the high-pass filtered video output signal;

a first high-pass filter that receives the video input signal, the first high-pass filter providing a first high-pass filtered signal;

a second high-pass filter that receives the video input signal, the second high-pass filter providing a second high-pass filtered signal;

a coring unit that receives and processes the first high-pass filtered signal, and having a control input that receives a signal indicative of the second high-pass filtered signal, where the coring unit provides a coring unit output signal and has a predetermined transfer function to operate on the first high-pass filtered signal in dependence on a parameter that depends on the second high-pass filtered signal to thereby provide the coring unit output signal; and a difference unit that receives the coring unit output signal and the video input signal and provides the high-pass filtered video output signal.

18. The filter device of claim 17, further comprising a logic unit that forms the absolute value of the second high-pass filtered signal.

19. The filter device of claim 17, further comprising an amplifier connected to the second high-pass filtered signal.

20. The filter device of claim 17, where the amplifier has a gain between 0 and 1.

21. The filter device of claim 17, where the first high-pass filter has a transfer function expressed by:

$H1(z) = k1 \cdot [-z^{-2} + 2z^{-1} - 1]$ where k1 is a constant.

22. The filter device of claim 21, where the constant k1 is equal to 0.5.

23. The filter device of claim 17, where the second high-pass filter has a transfer function expressed by:

$H2(z) = k2 \cdot [z^{-2} + 0 \cdot z^{-1} - 1]$ where k2 is a constant.

24. The filter device of claim 23, where the constant k2 is equal to 0.5.

25. The filter device of claim 17, where the transfer function of the coring unit is expressed by:

$hp(k) = hp1(k) - p(k)$ for $hp1(k) > p(k)$ $hp(k) = 0$ for $-p(k) \leq hp1(k) \leq p(k)$ $hp(k) = hp1(k) + p(k)$ for $hp1(k) < -p(k)$ where hp(k) isc(k) is a signal at the output of the coring unit, p(k) is the second high-pass filtered signal at the control input of the coring unit, and hp1(k) is first high-pass filtered signal at the signal input of the coring unit.

26. The filter device of claim 17, further comprising a limiter connected between the output of the coring unit and the output of the filter device.

27. A method for processing a video input signal to generate a filtered video signal value, comprising the steps of:

a) providing from the input video signal a first signal value, a second signal value, and a third signal value;

b) determining an interval defined by the second signal value and the third signal value, with a first interval boundary depending on the second signal value and a second interval boundary depending on the third signal value;

c) determining a mean value from the second signal value and the third signal value;

d) determining whether the first signal value lies within the interval;

e) if the first signal value lies outside the interval, determining a first distance between the first signal value and the first interval boundary and a second distance between the first signal value and the second interval boundary and a third distance between the first signal value and the mean value to generate a first, a second, and a third distance value, selecting a value from a value range between the smaller of the first and second distance values and the third distance value;

f) if the first signal value lies within the interval, selecting a value from a value range between zero and the half-interval width; and g) setting the sign of the selected value depending on the position of the first signal value relative to the mean value to provide the filtered video signal value.

28. The method of claim 27, further comprising the step of subtracting the filtered video signal value from the first signal value to provide a second filtered video signal value.

29. The method of claim 28, further comprising a step for interpolating a video pixel when generating a frame from first and second consecutive interlaced video fields, wherein:

the first signal value corresponds to a video information value of the second field at a position of the pixel being interpolated;

the second signal value corresponds to a video information value of the first field at a first position adjacent the position of the pixel being interpolated; and the third signal value corresponds to a video information value of the first field at a second position adjacent the position of the pixel being interpolated.

30. The method of claim 28, further comprising the step of vector-based interpolation of a video pixel of an intermediate image, which lies in between a first image and a second image, wherein the video pixel is assigned at least a first motion vector and a second motion vector and wherein:

the first signal value corresponds to a mixed value from a video information value of the video pixel at a starting point of the first motion vector in the first image and a video pixel at an end point of the first motion vector in the second image;

the second signal value corresponds to a video information value of a video pixel at a starting point of the second motion vector in the first image; and the third signal value corresponds to a video information value of a video pixel at an end point of the second motion vector in the second image.

31. The method of claim 30, where the mixed value corresponds to the mean value of the video pixels at the starting point and at the end point of the first motion vector in the first image and the second image.

32. A method for filtering a video input signal having a sequence of values to provide a filtered video output signal for video display, comprising the steps of:

a) selecting a first signal value of the video input signal sequence to be filtered, and selecting a second signal value preceding the first signal value in the video input signal sequence and a third signal value following the first signal value in the video input signal sequence;

b) determining an interval from the second signal value and the third signal value, a first interval boundary depending on the second signal value and a second interval boundary depending on the third signal value;

c) determining a mean value of the interval;

d) determining if the first signal value is within the interval;

e) if the first signal value is outside the interval, determining a first distance between the first signal value and the first interval boundary and a second distance between the first signal value and the second interval boundary and a third distance between the first signal value and the mean value to provide first, second, and third distance values, and selecting a signal value from between the smaller of the first and second distance values and the third distance value to provide a selected signal value;

f) if the first signal value is inside the interval, selecting a signal value from between zero and half the interval width to provide the selected signal value;

g) setting the sign of the selected signal value depending on the position of the first signal value relative to the mean value to provide a high-pass filtered video output signal; and h) generating a low-pass filtered video output signal from the high-pass filtered video output signal and the video input signal.

* * * * *

UNITED STATES PATENT AND TRADEMARK OFFICE
CERTIFICATE OF CORRECTION

PATENT NO. : 7,318,079 B2 Page 1 of 1
APPLICATION NO. : 10/872151
DATED : January 8, 2008
INVENTOR(S) : Marko Hahn It is certified that error appears in the above-identified patent and that said Letters Patent is hereby corrected as shown below:

Column 15
Line 15, before "video" insert --a--

Signed and Sealed this

Twenty-ninth Day of April, 2008

JON W. DUDAS
*Director of the United States Patent and Trademark Office*